United States Patent
Gocho

(10) Patent No.: US 10,991,723 B2
(45) Date of Patent: Apr. 27, 2021

(54) SEMICONDUCTOR DEVICE, METHOD OF MANUFACTURING SEMICONDUCTOR DEVICE, AND ELECTRONIC APPARATUS

(71) Applicant: SONY SEMICONDUCTOR SOLUTIONS CORPORATION, Kanagawa (JP)

(72) Inventor: Tetsuo Gocho, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 14 days.

(21) Appl. No.: 16/482,417

(22) PCT Filed: Jan. 17, 2018

(86) PCT No.: PCT/JP2018/001143
§ 371 (c)(1),
(2) Date: Jul. 31, 2019

(87) PCT Pub. No.: WO2018/159126
PCT Pub. Date: Sep. 7, 2018

(65) Prior Publication Data
US 2020/0035710 A1 Jan. 30, 2020

(30) Foreign Application Priority Data
Mar. 3, 2017 (JP) .............................. JP2017-040702

(51) Int. Cl.
*H01L 27/12* (2006.01)
*H01L 21/762* (2006.01)
(Continued)

(52) U.S. Cl.
CPC .... *H01L 27/1207* (2013.01); *H01L 21/76283* (2013.01); *H01L 21/84* (2013.01);
(Continued)

(58) Field of Classification Search
CPC .................................................. H01L 27/1207
(Continued)

(56) References Cited

U.S. PATENT DOCUMENTS 9,716,138 B1 * 7/2017 Zang ................... H01L 29/1087
9,893,157 B1 * 2/2018 Feilchenfeld ....... H01L 29/1087
(Continued)

FOREIGN PATENT DOCUMENTS

CN 103137705 A 6/2013
CN 104218040 A 12/2014
(Continued)

OTHER PUBLICATIONS

International Search Report and Written Opinion of PCT Application No. PCT/JP2018/001143, dated Apr. 3, 2018, 08 pages of ISRWO.

*Primary Examiner* — Ajay Arora
(74) *Attorney, Agent, or Firm* — Chip Law Group

(57) ABSTRACT

A semiconductor device according to an embodiment of the present disclosure includes: an SOI substrate in which a silicon substrate layer, a first insulating layer, and a semiconductor layer are layered in this order; a first transistor provided on the semiconductor layer; a second transistor provided on the silicon substrate layer and withstanding a higher voltage than the first transistor; and an element separation film provided between the first transistor and the second transistor, in which the element separation film includes a second insulating layer embedded in an opening that penetrates the semiconductor layer and the first insulating layer and reaches an inside of the silicon substrate layer, and a portion of the second insulating layer constitutes a gate insulating film of the second transistor.

10 Claims, 23 Drawing Sheets

(51) Int. Cl.
*H01L 21/84* (2006.01)
*H01L 27/146* (2006.01)
*H01L 21/02* (2006.01)
*H01L 21/28* (2006.01)
*H01L 21/3105* (2006.01)
*H01L 21/311* (2006.01)
*H01L 29/08* (2006.01)
*H01L 29/167* (2006.01)
*H01L 29/49* (2006.01)
*H01L 29/51* (2006.01)

(52) U.S. Cl.
CPC .. *H01L 27/14612* (2013.01); *H01L 27/14689* (2013.01); *H01L 21/0217* (2013.01); *H01L 21/02164* (2013.01); *H01L 21/02181* (2013.01); *H01L 21/02271* (2013.01); *H01L 21/02274* (2013.01); *H01L 21/28035* (2013.01); *H01L 21/31053* (2013.01); *H01L 21/31111* (2013.01); *H01L 21/31144* (2013.01); *H01L 29/0847* (2013.01); *H01L 29/167* (2013.01); *H01L 29/4916* (2013.01); *H01L 29/517* (2013.01)

(58) Field of Classification Search
USPC ........................................................ 257/348
See application file for complete search history.

(56) References Cited

U.S. PATENT DOCUMENTS

| | | | |
|---|---|---|---|
| 2013/0119469 A1* | 5/2013 | Iwamatsu | H01L 27/1104 257/347 |
| 2013/0119470 A1 | 5/2013 | Horita et al. | |
| 2013/0140669 A1 | 6/2013 | Yugami et al. | |
| 2014/0353756 A1 | 12/2014 | Yamamoto | |

FOREIGN PATENT DOCUMENTS

| | | |
|---|---|---|
| JP | 2006-324415 A | 11/2006 |
| JP | 2008-085138 A | 4/2008 |
| JP | 2013-105981 A | 5/2013 |
| JP | 2013-105982 A | 5/2013 |
| JP | 2013-118317 A | 6/2013 |
| JP | 2014-143269 A | 8/2014 |
| JP | 2014-236097 A | 12/2014 |
| TW | 201330269 A | 7/2013 |

\* cited by examiner

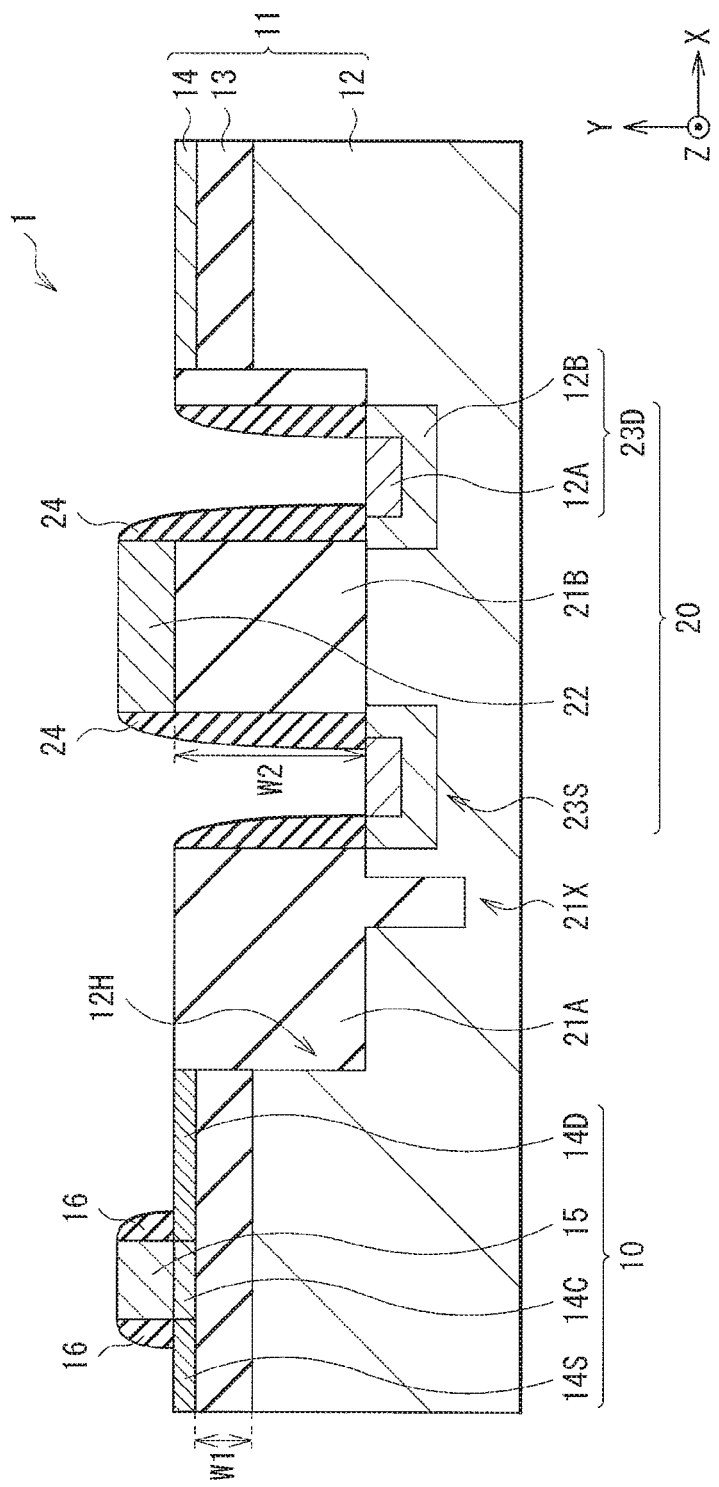
[FIG. 1]

[ FIG. 2A ]
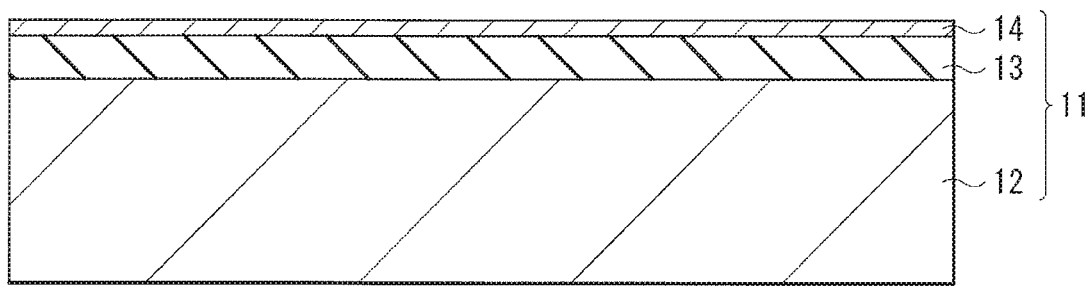
[ FIG. 2B ]
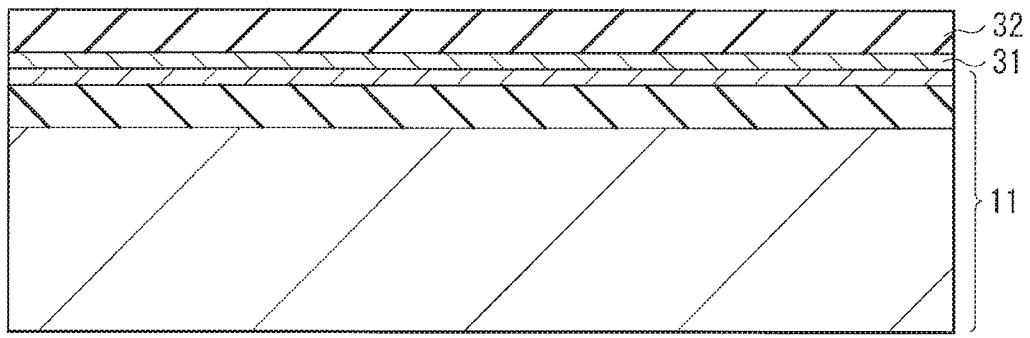

[FIG. 2C]
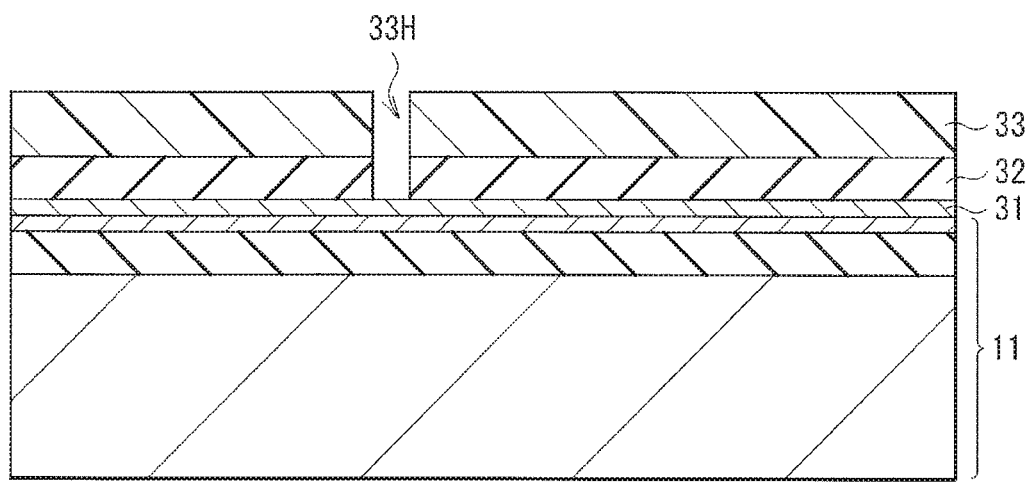
[FIG. 2D]
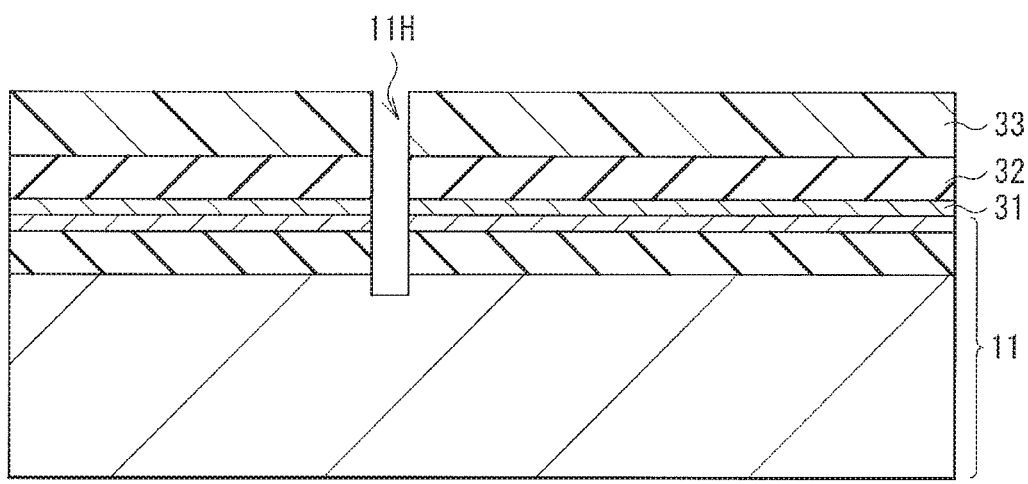

[ FIG. 3A ]
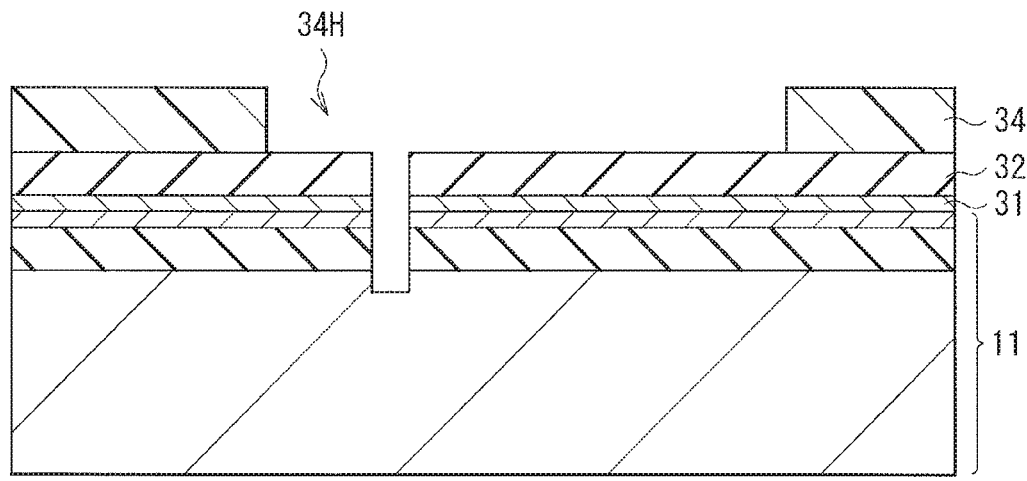
[ FIG. 3B ]
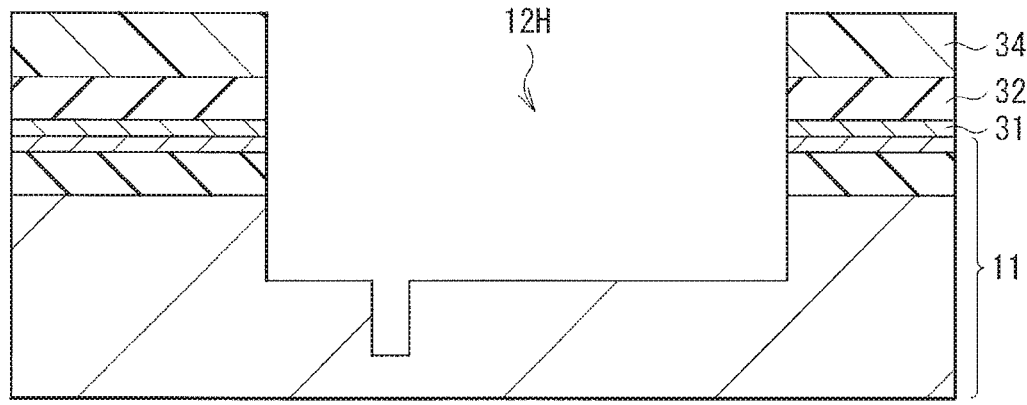
[ FIG. 3C ]
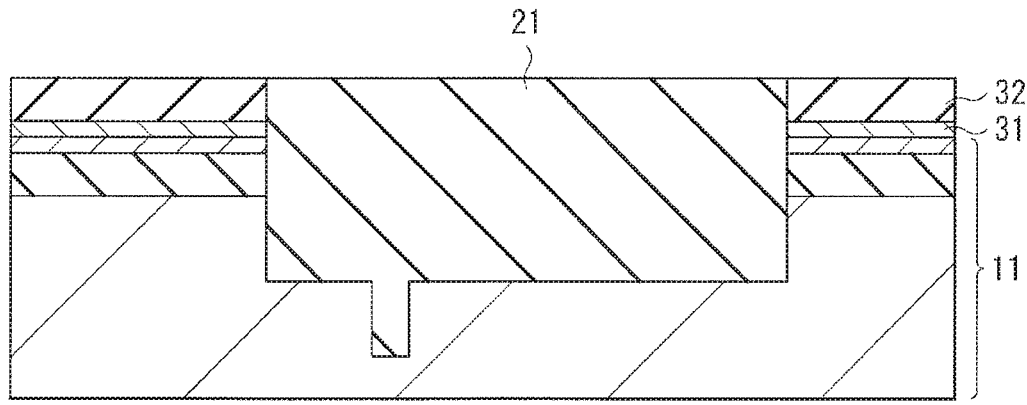

[FIG. 4A]
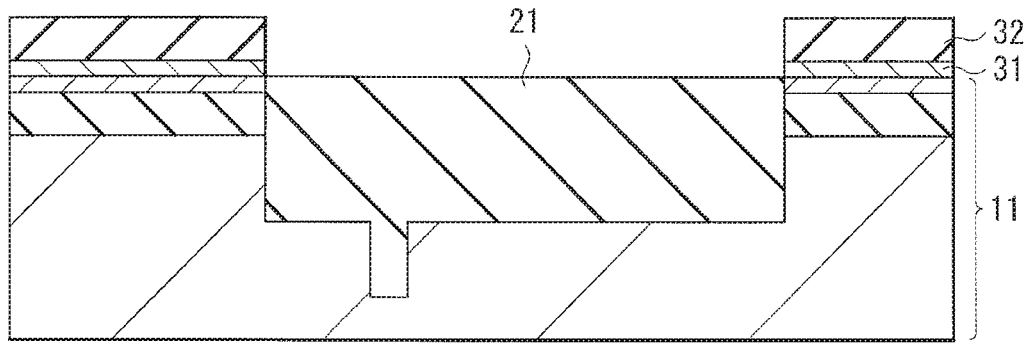
[FIG. 4B]
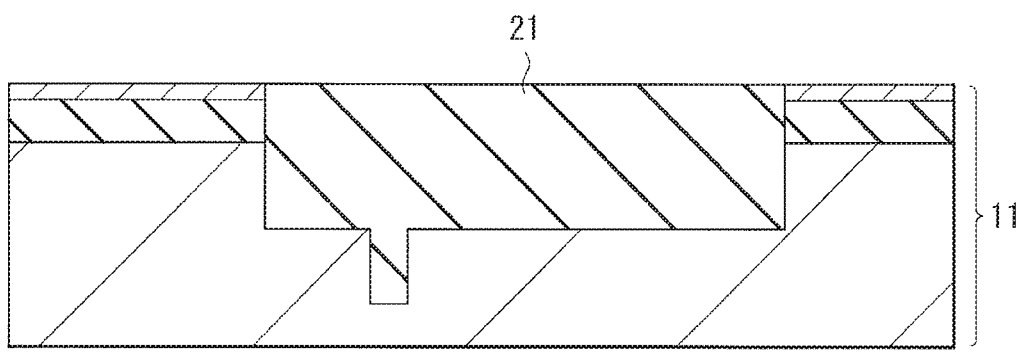
[FIG. 4C]
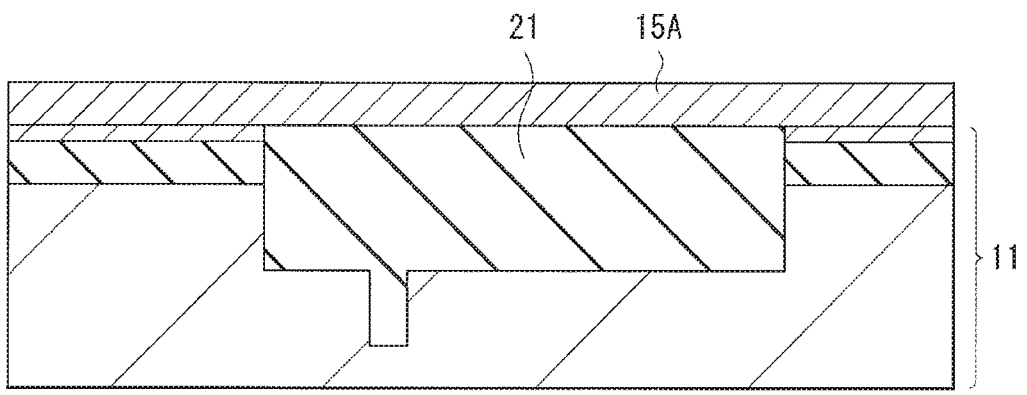

[FIG. 5A]
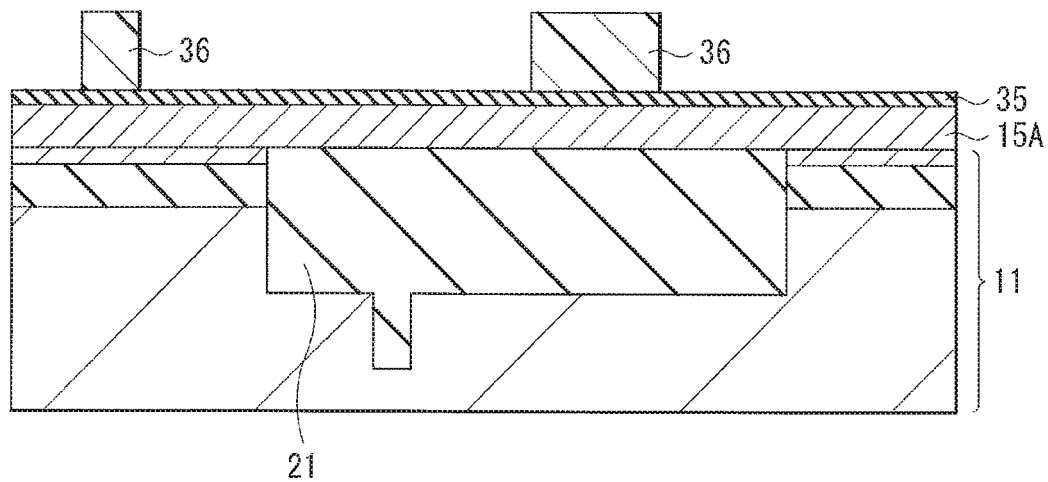
[FIG. 5B]
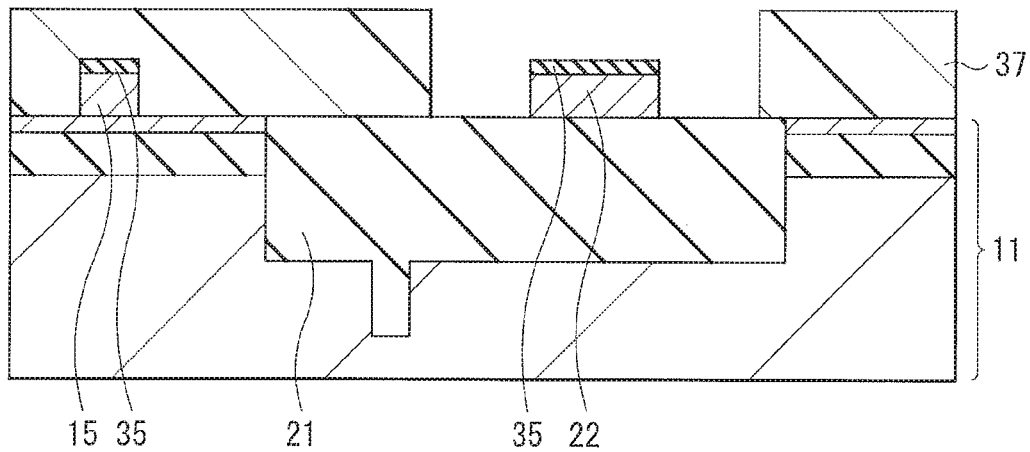
[FIG. 5C]
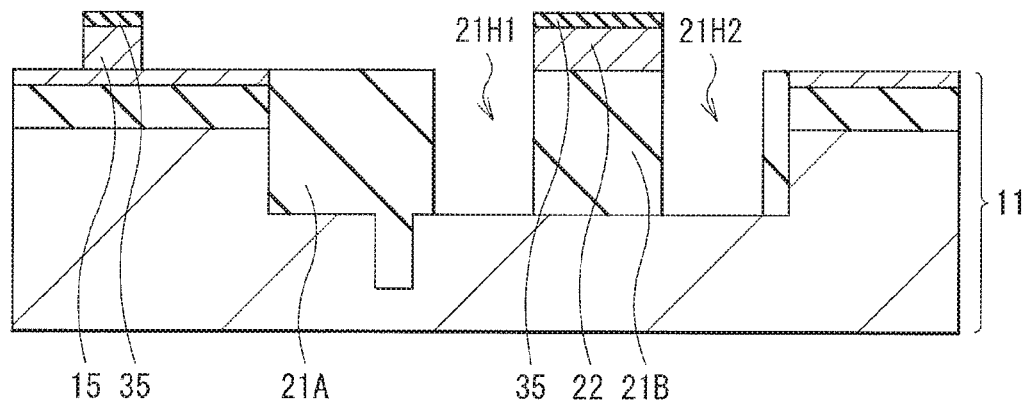

[FIG. 6A]
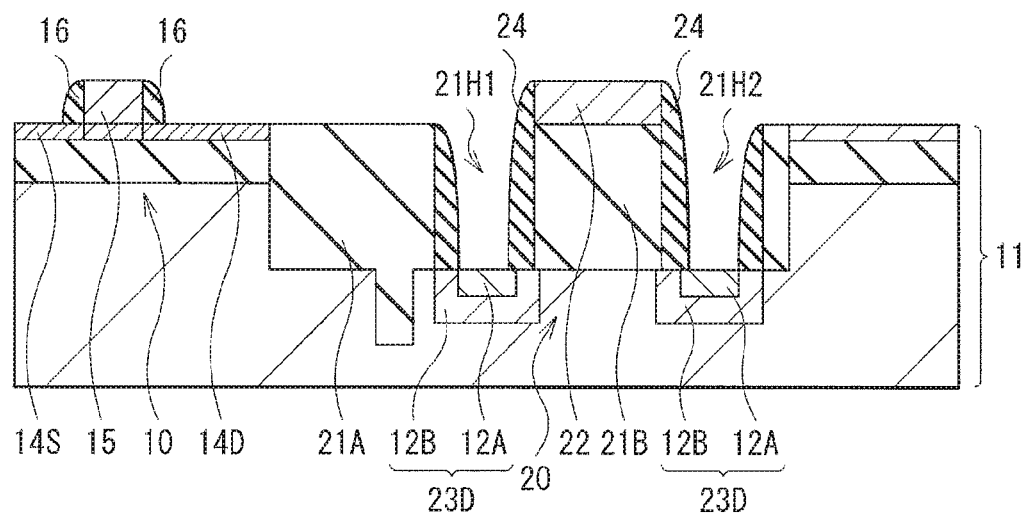
[FIG. 6B]
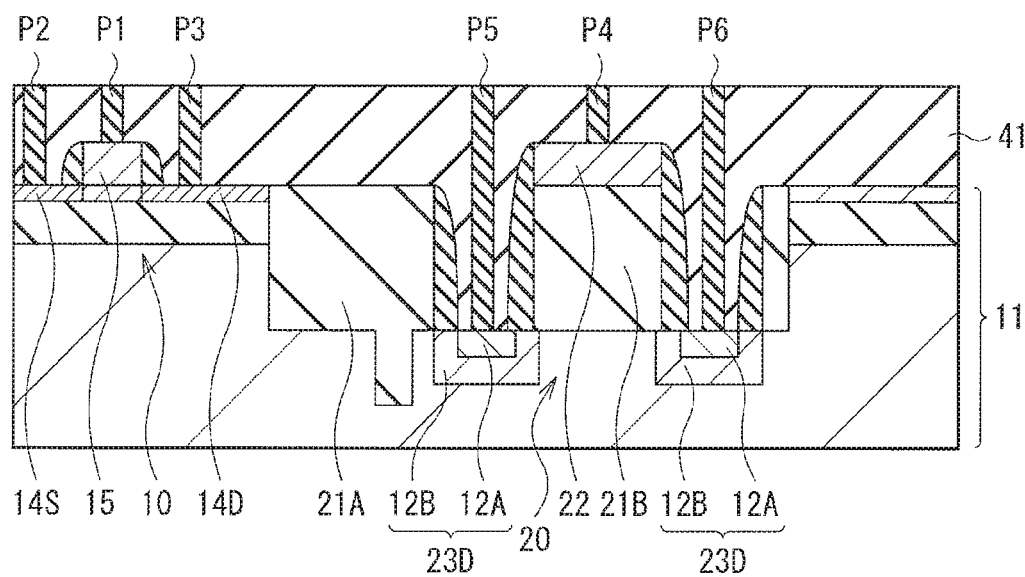

[ FIG. 7A ]
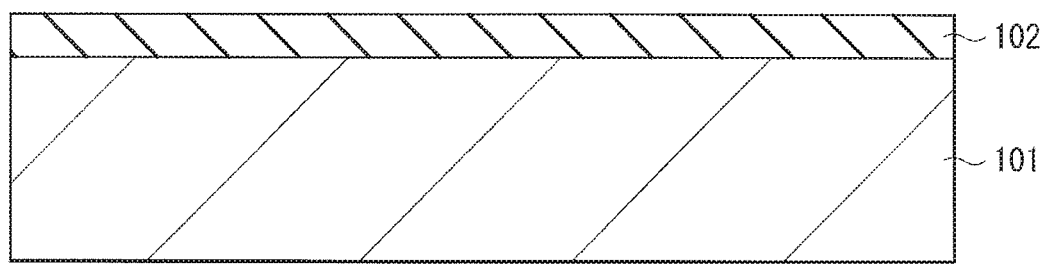
[ FIG. 7B ]
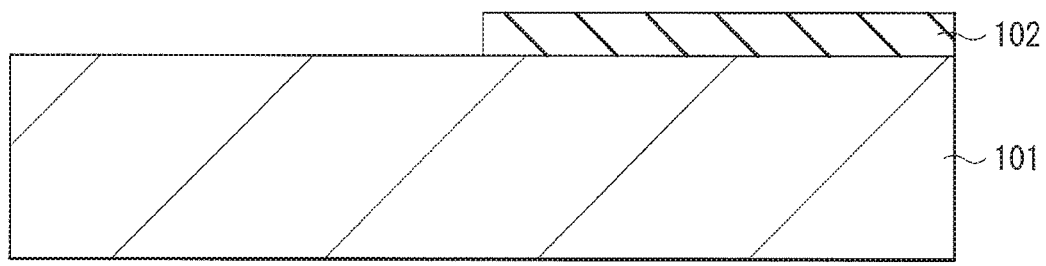
[ FIG. 7C ]
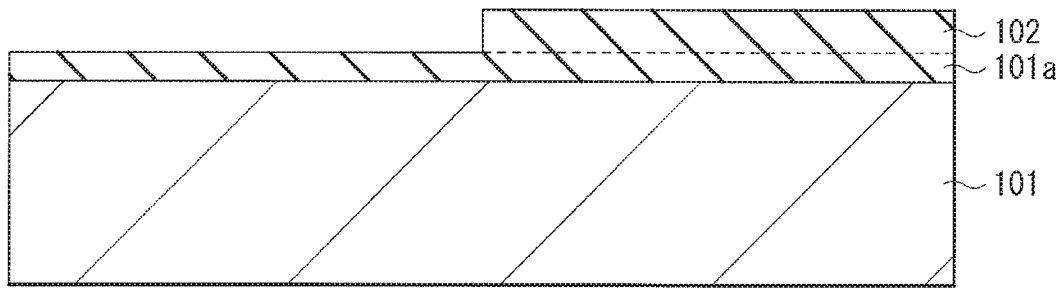

[FIG. 8A]
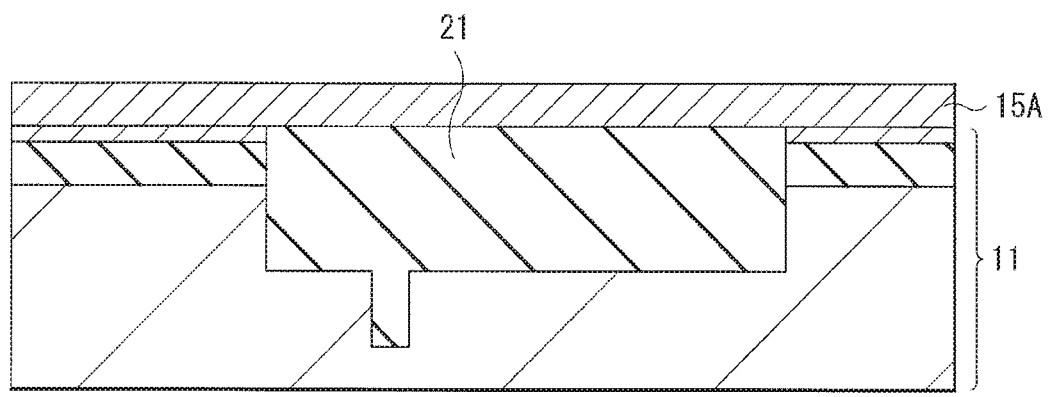
[FIG. 8B]
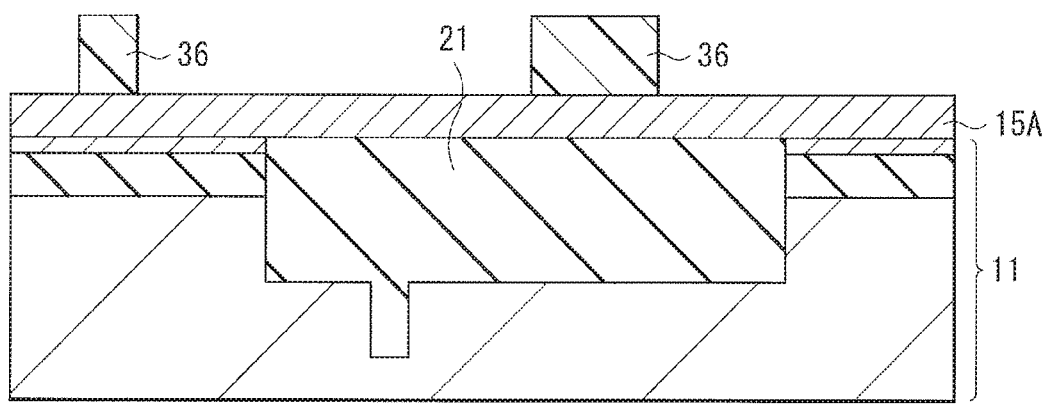

[FIG. 8C]
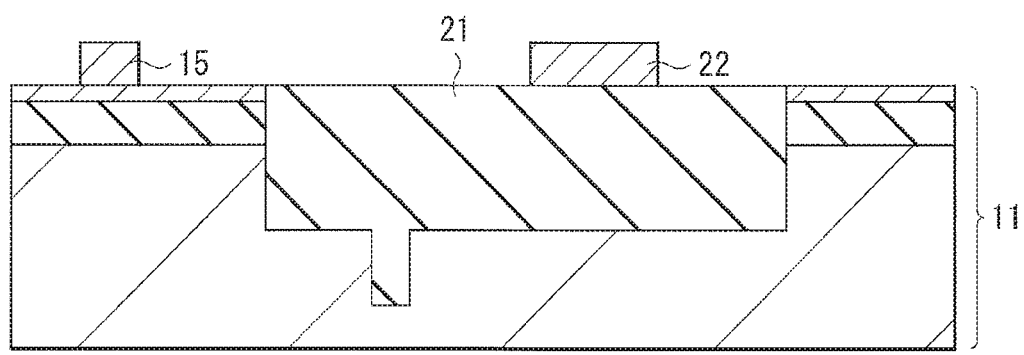
[FIG. 8D]
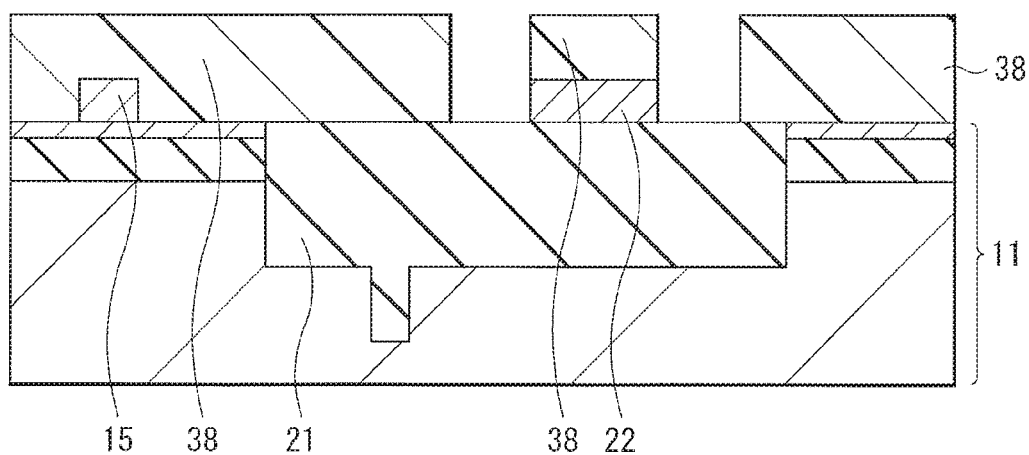

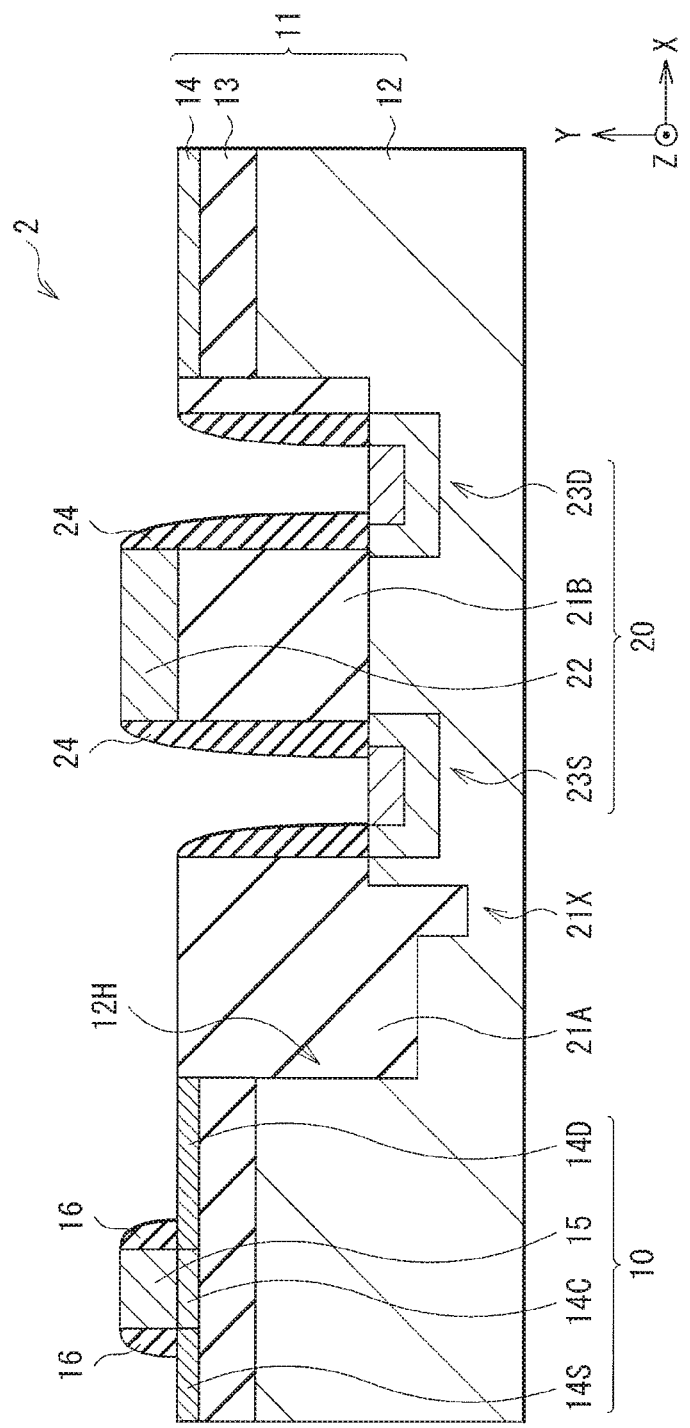
[FIG. 9]

[ FIG. 10A ]
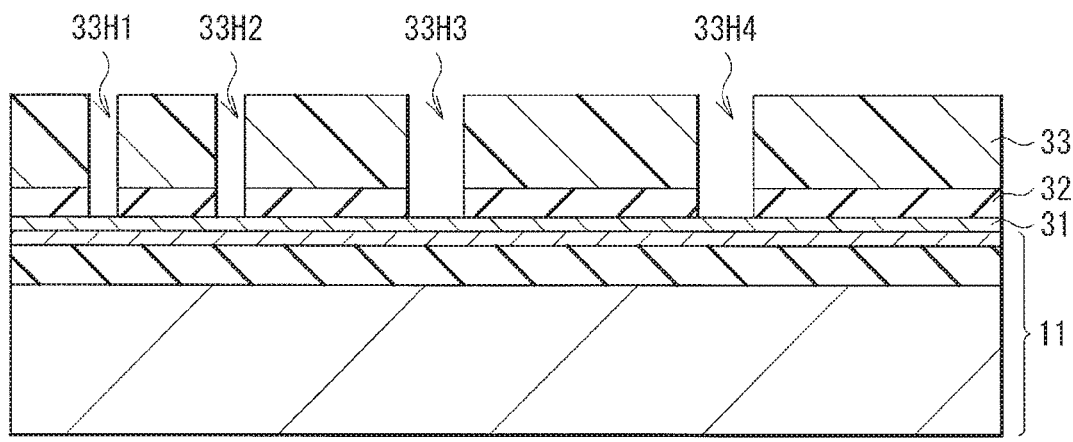
[ FIG. 10B ]
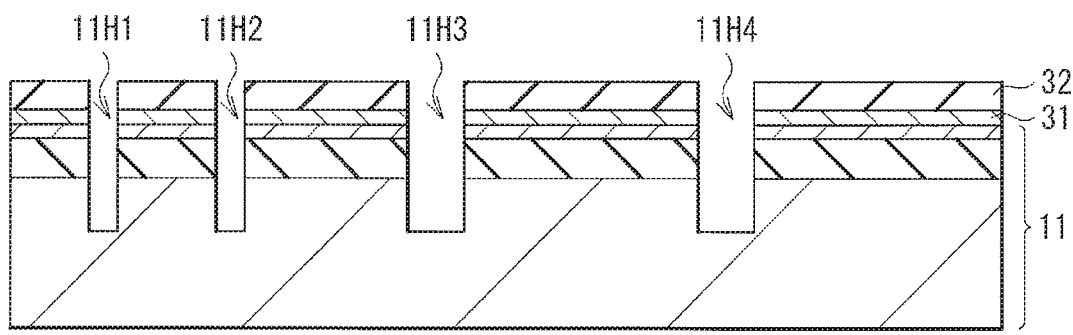
[ FIG. 10C ]
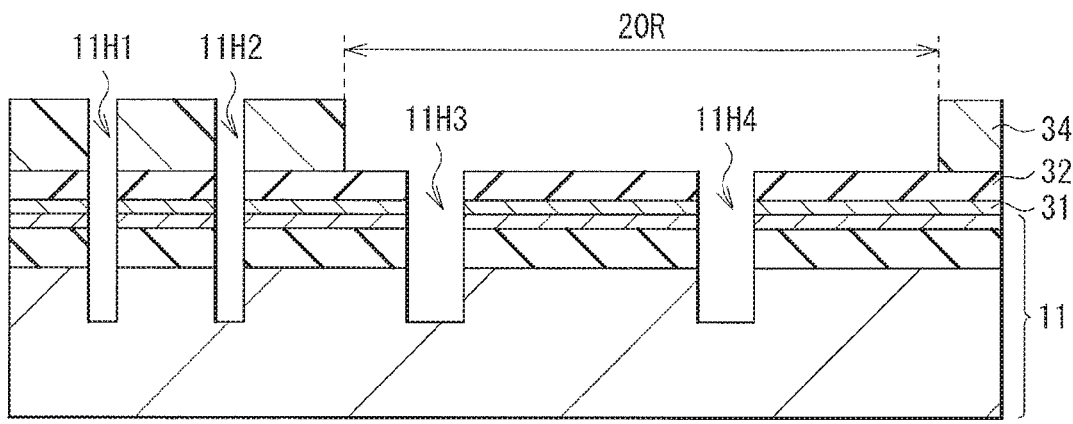

[FIG. 11A]
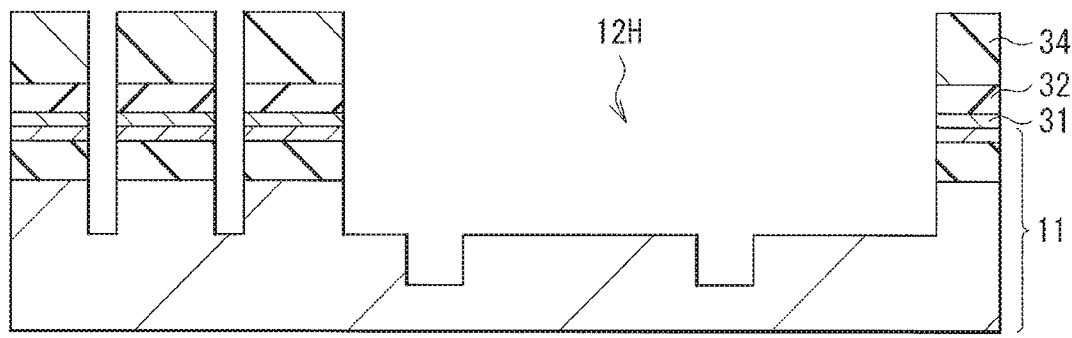
[FIG. 11B]
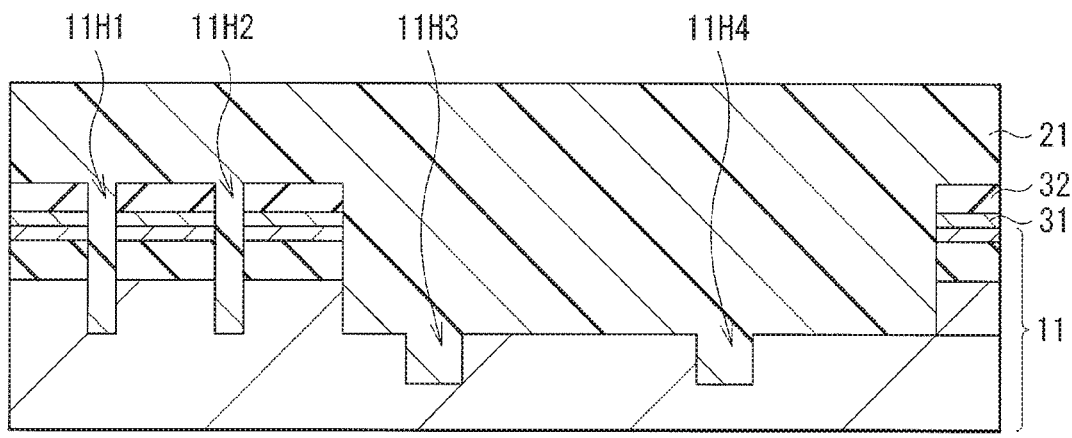
[FIG. 11C]
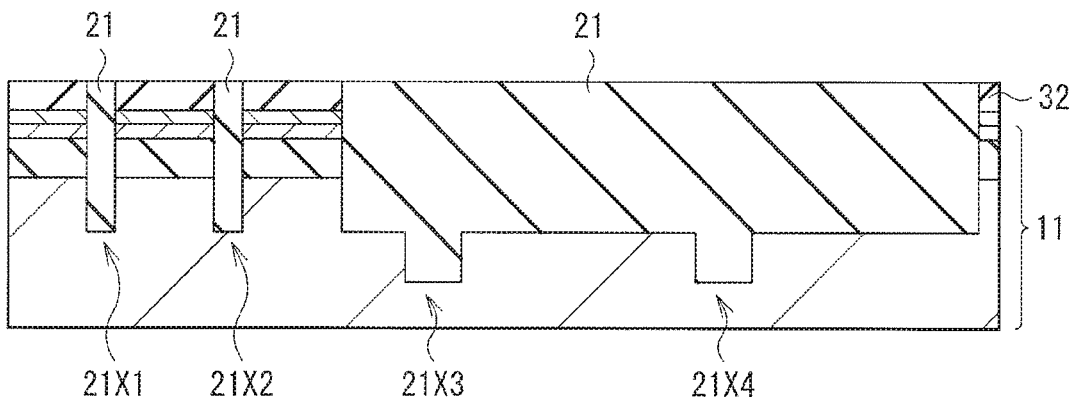

[ FIG. 12A ]
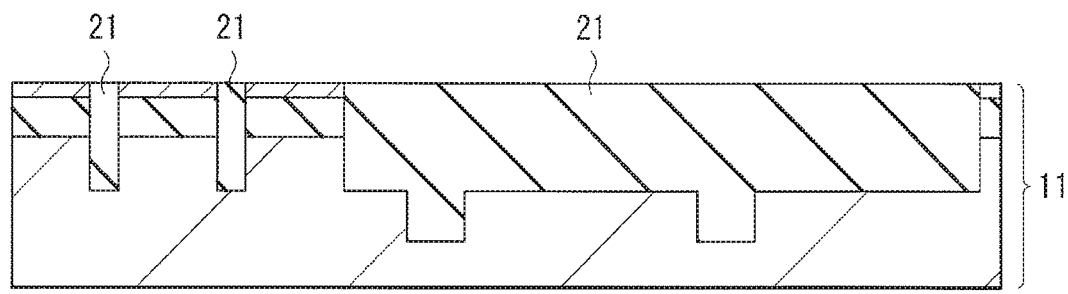
[ FIG. 12B ]
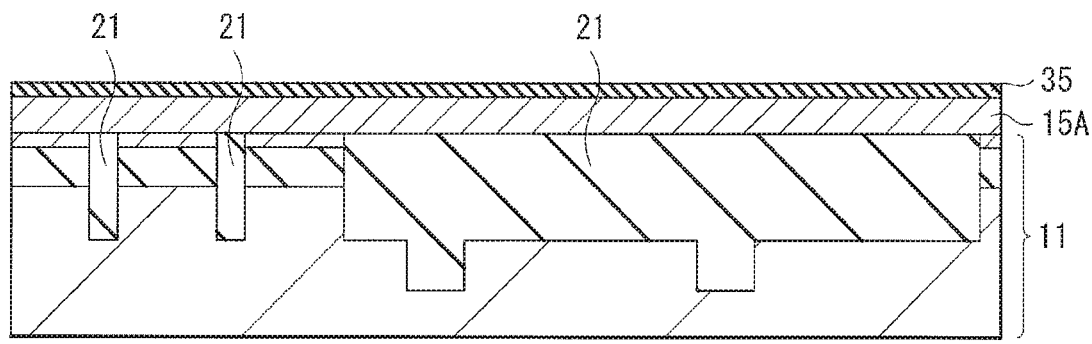
[ FIG. 12C ]
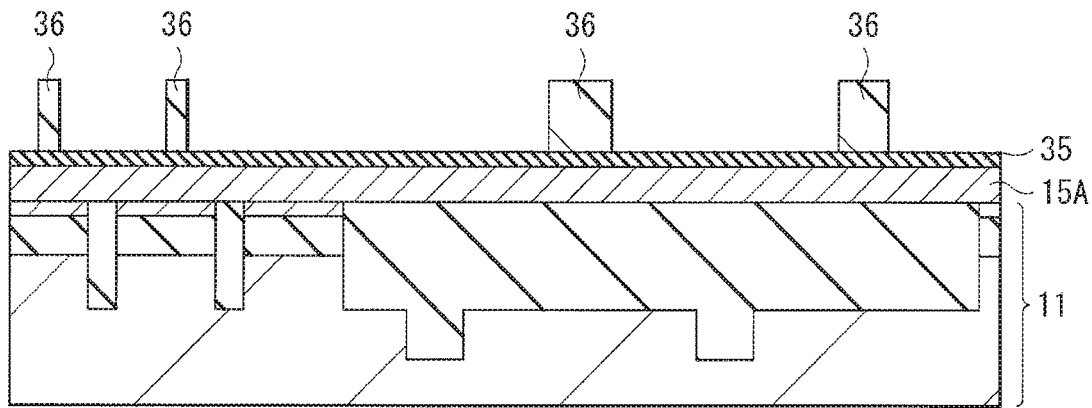

[FIG. 13A]
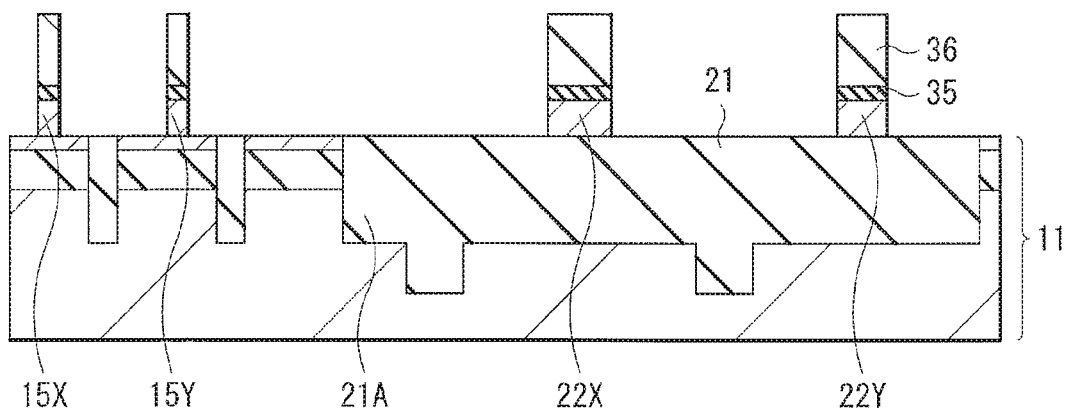
[FIG. 13B]
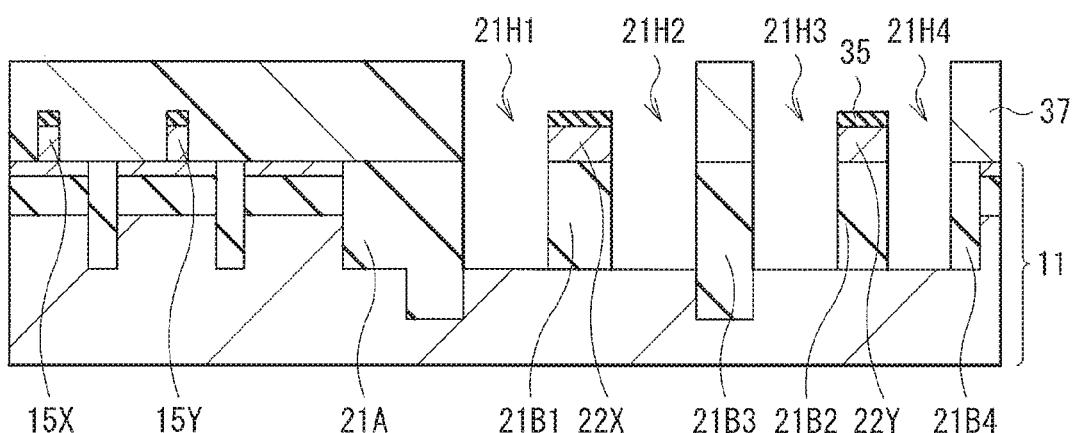
[FIG. 13C]
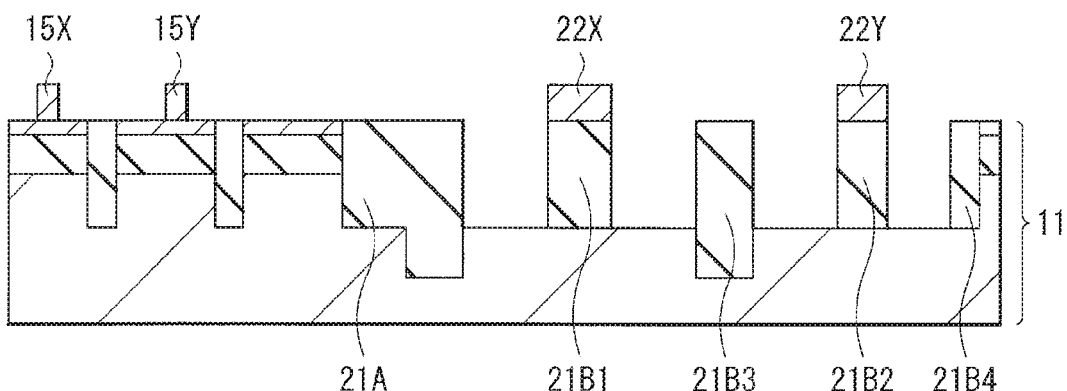

[FIG. 14A]
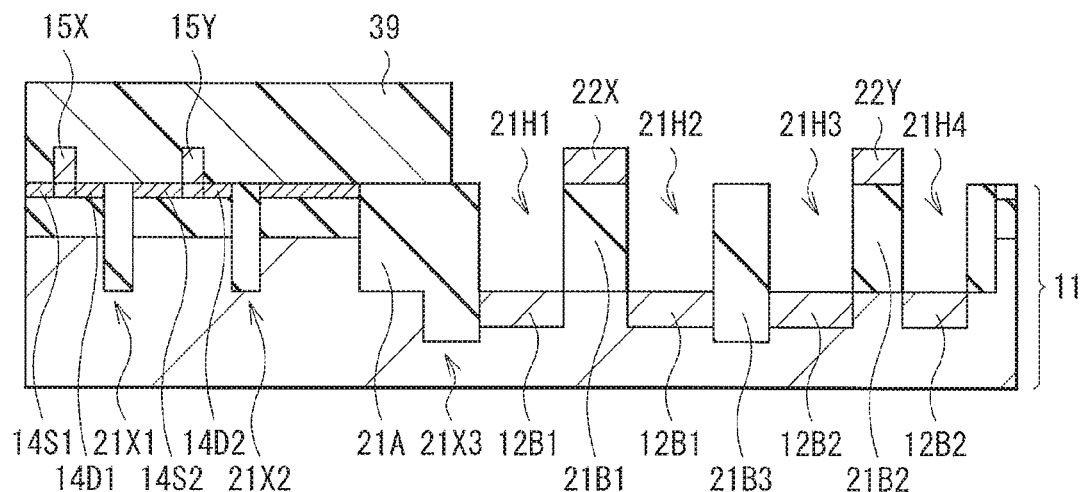
[FIG. 14B]
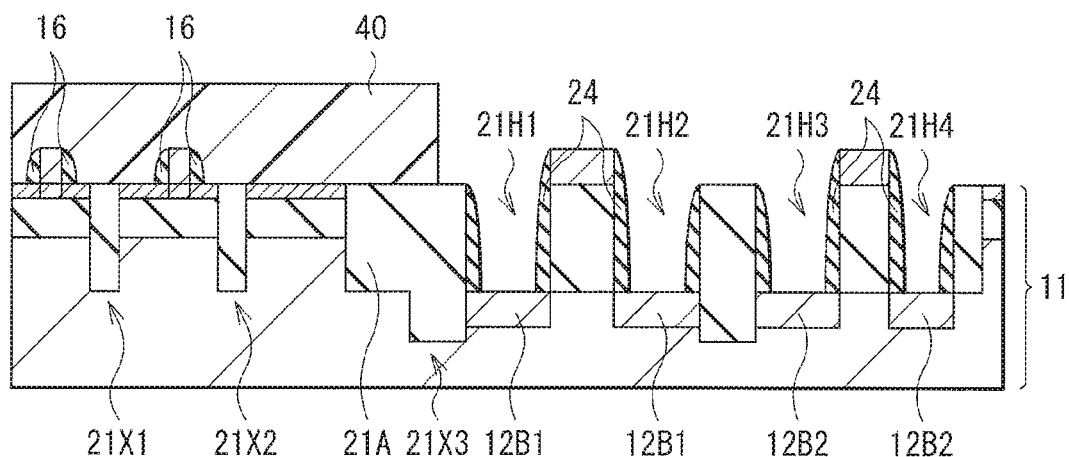
[FIG. 14C]
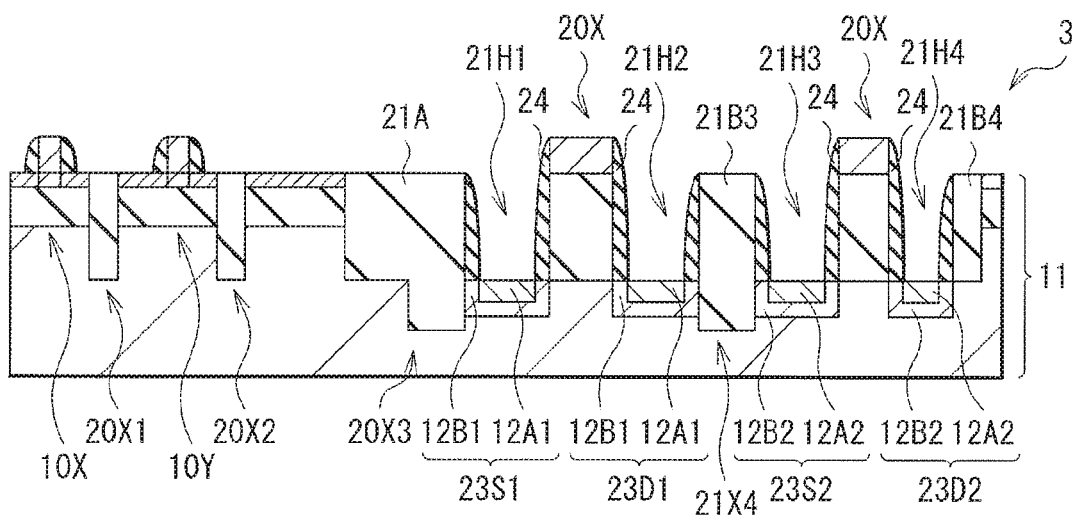

[ FIG. 15A ]
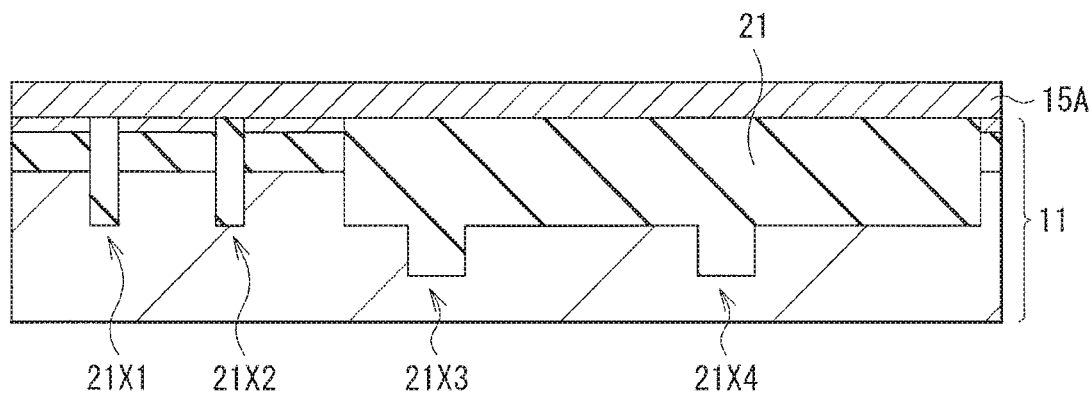
[ FIG. 15B ]
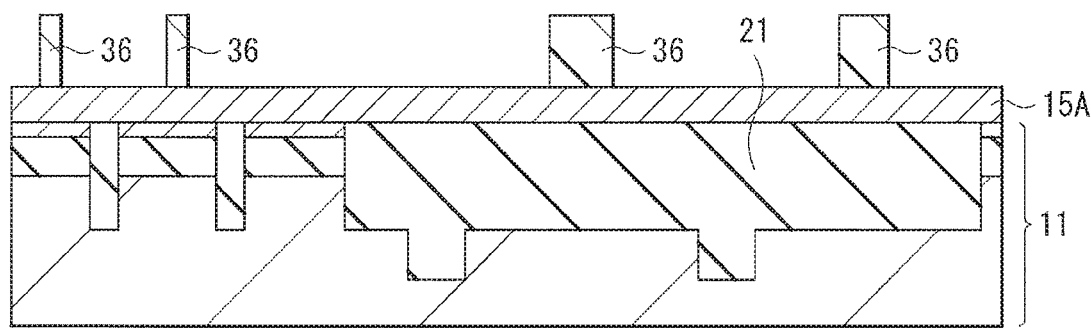
[ FIG. 15C ]
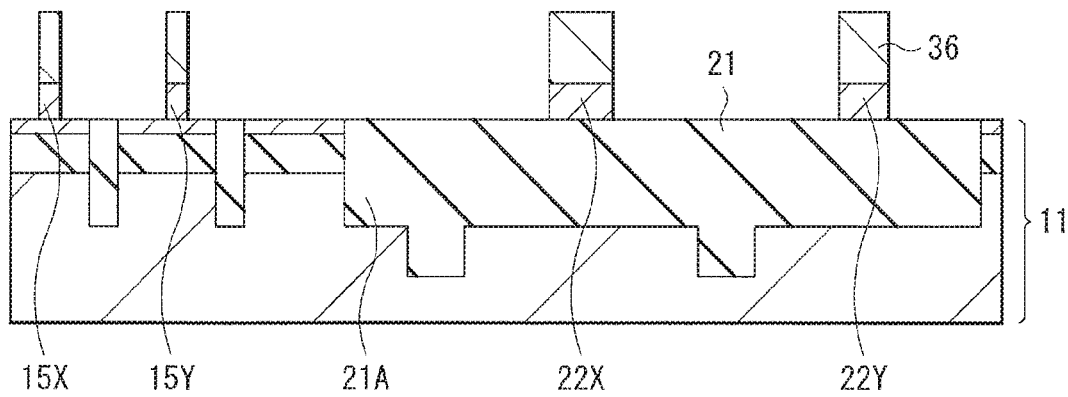

[ FIG. 16A ]
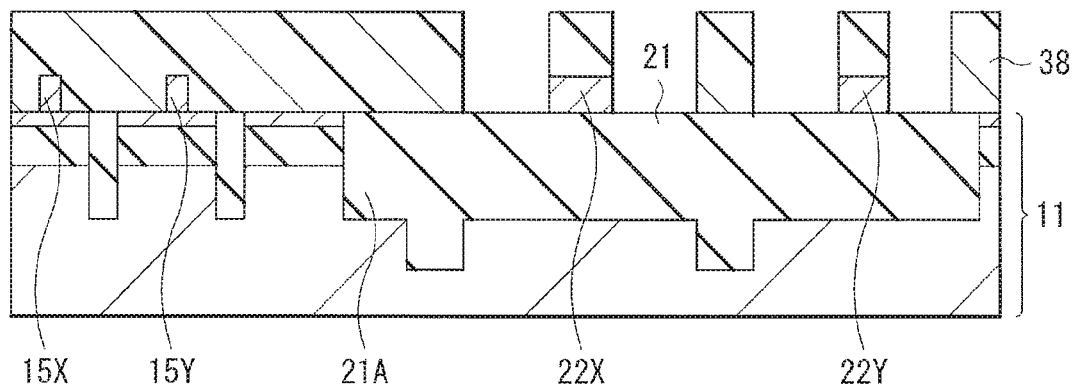
[ FIG. 16B ]
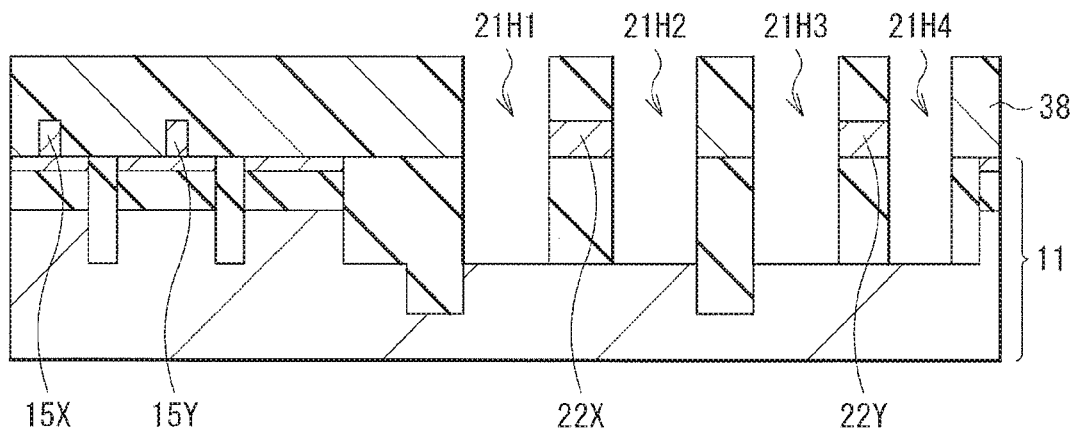

[ FIG. 17 ]
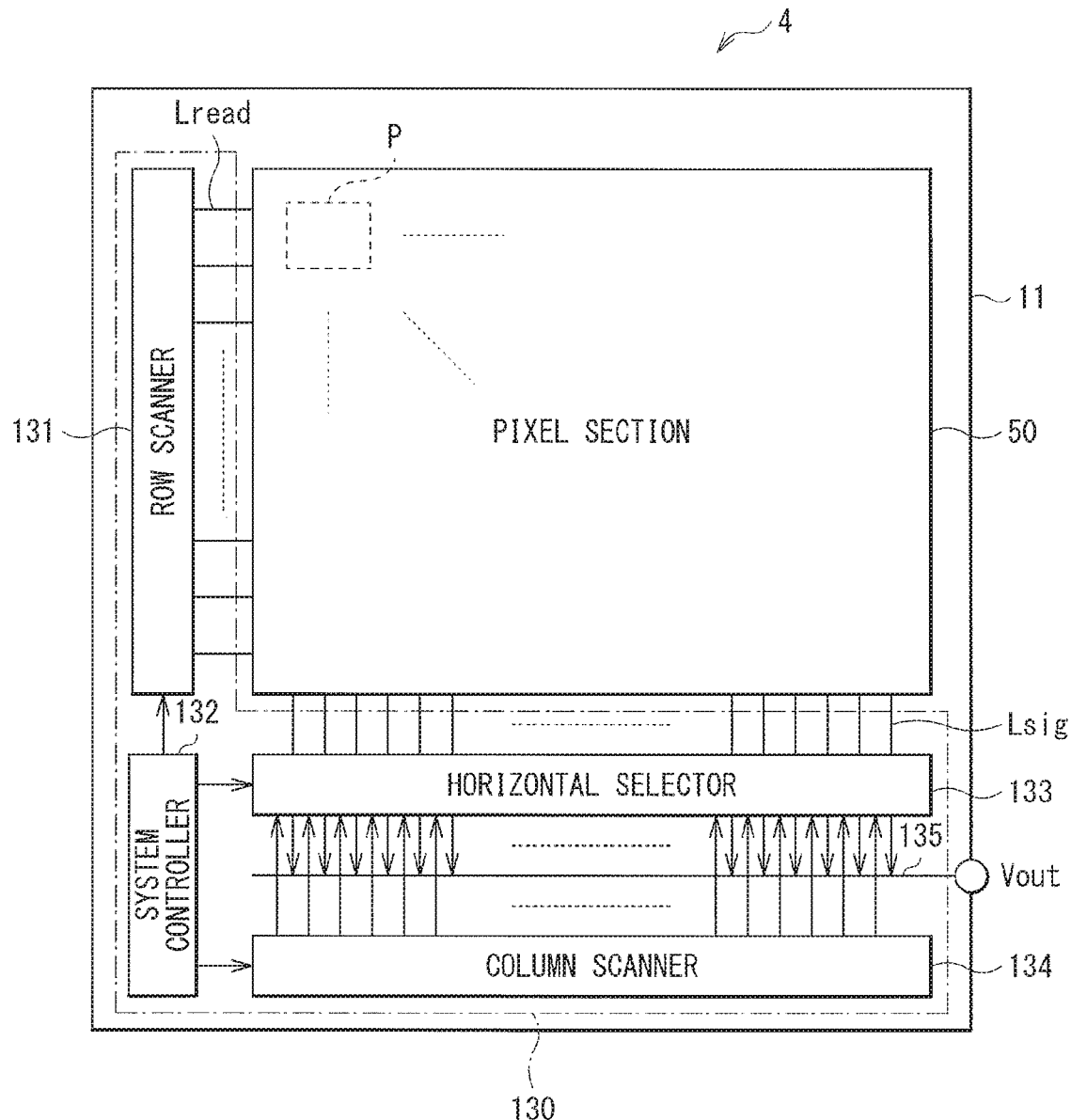

[FIG. 18]
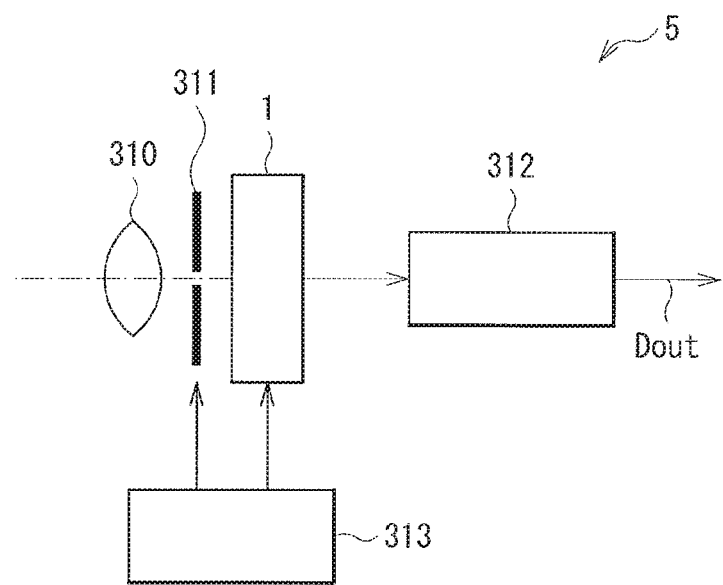

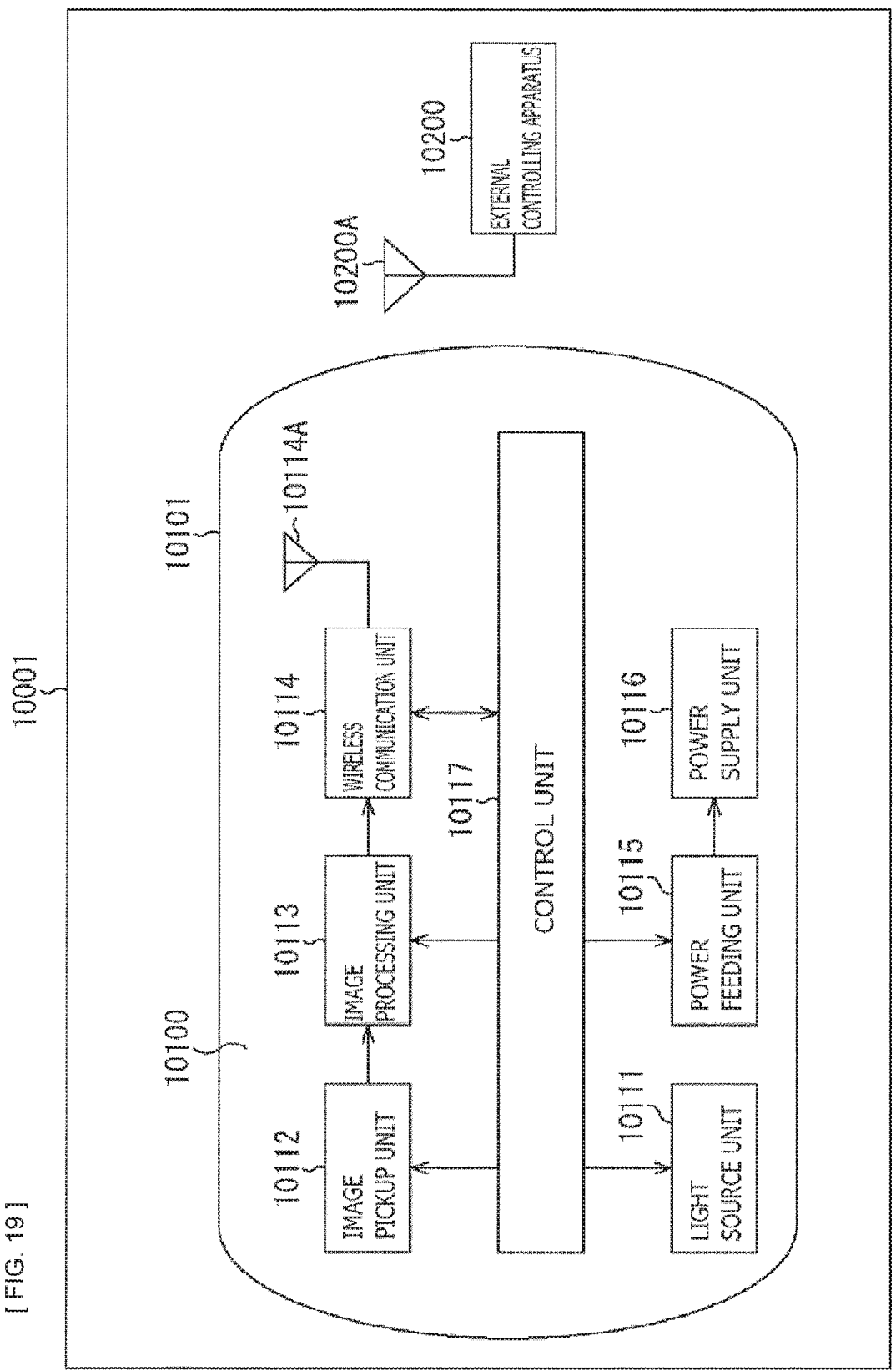
[FIG. 19]

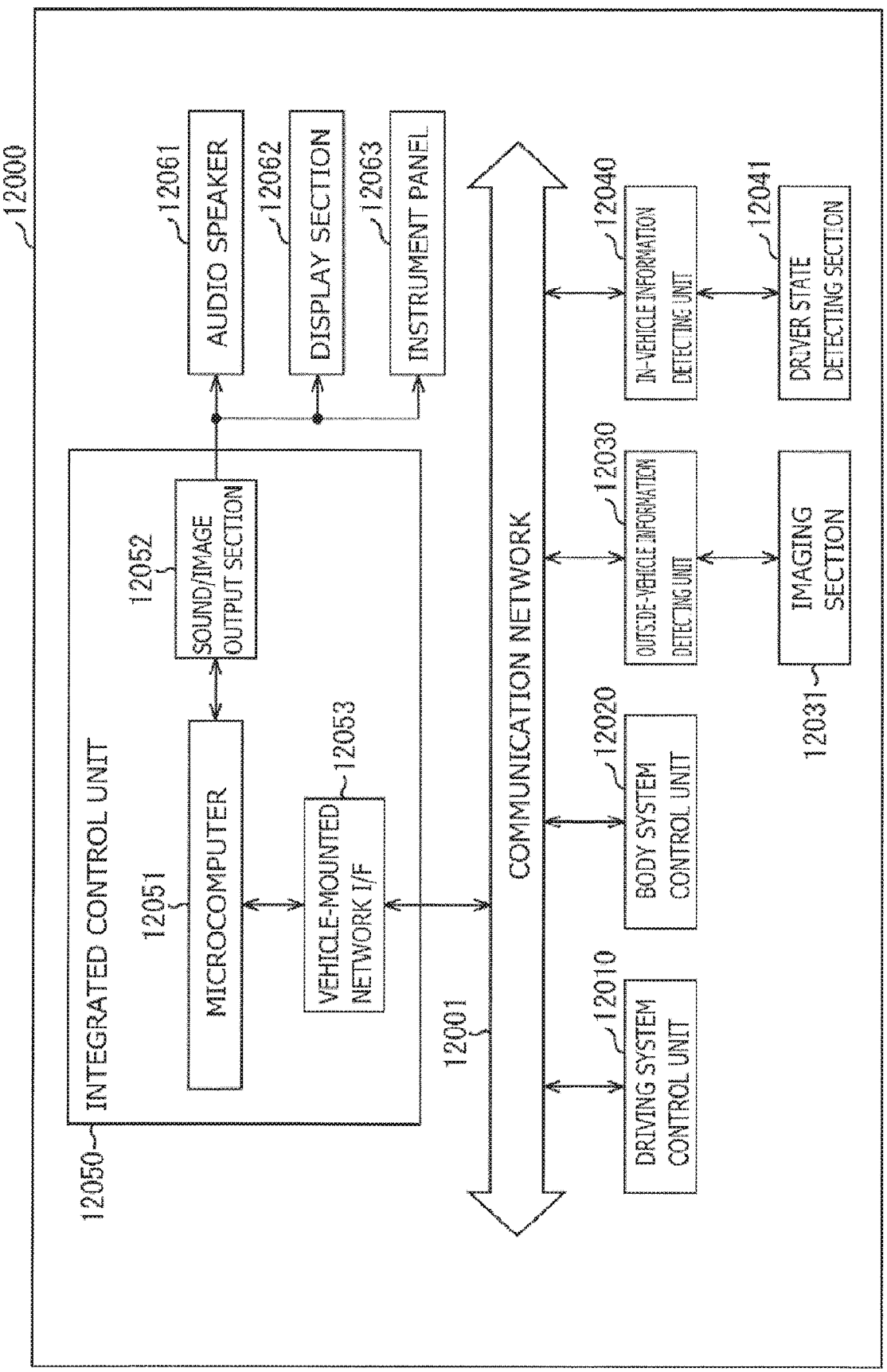
[FIG. 20]

[ FIG. 21 ]
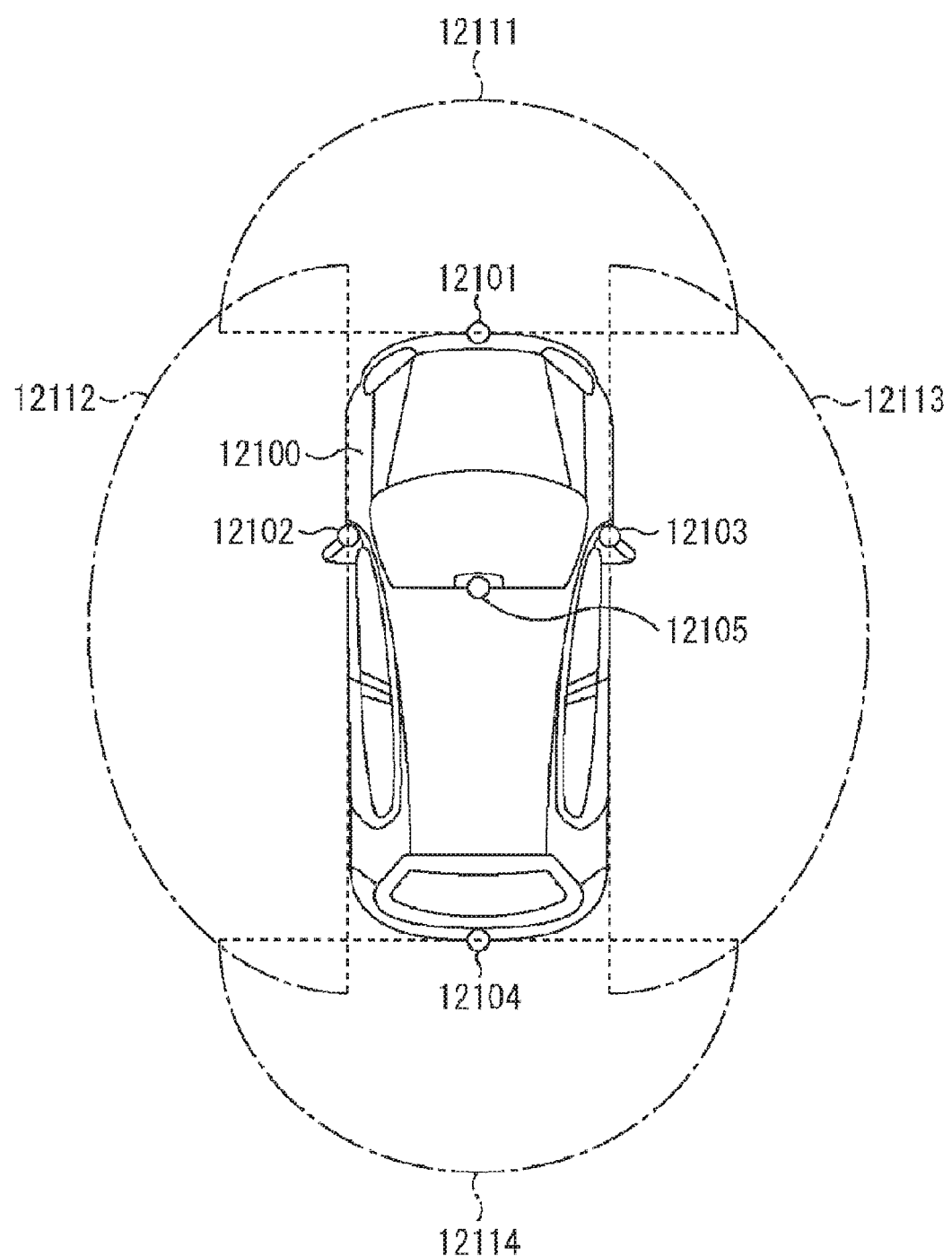

SEMICONDUCTOR DEVICE, METHOD OF MANUFACTURING SEMICONDUCTOR DEVICE, AND ELECTRONIC APPARATUS

CROSS REFERENCE TO RELATED APPLICATIONS

This application is a U.S. National Phase of International Patent Application No. PCT/JP2018/001143 filed on Jan. 17, 2018, which claims priority benefit of Japanese Patent Application No. JP 2017-040702 filed in the Japan Patent Office on Mar. 3, 2017. Each of the above-referenced applications is hereby incorporated herein by reference in its entirety.

TECHNICAL FIELD

The present disclosure relates to a semiconductor device including a plurality of transistors having different withstand voltages, a method of manufacturing the semiconductor device, and an electronic apparatus.

BACKGROUND ART

In recent years, image sensors having various functions have been developed with the aim of being used in medical applications, three-dimensional imaging, and the like. Such image sensors include transistors having different withstand voltages. For example, a distance-measuring image sensor using a single photon avalanche diode (SPAD) uses an advanced transistor (for example, a fully depleted (FD)-SOI transistor) that operates at a voltage of, for example, about 1 V or less, and a transistor (high-voltage transistor) that is able to receive a high voltage of, for example, several tens of volts or higher. The former transistor is used, for example, in a logic circuit, and the latter is used in a photon counting sensor. These transistors having different withstand voltages are typically formed on different substrates.

Meanwhile, for example, PTLs 1 and 2 each disclose a semiconductor device in which transistors having different withstand voltages are disposed on the same substrate. In the semiconductor device described in PTL 1, high-voltage transistors are disposed on a semiconductor layer of an SOI substrate. In the semiconductor device described in PTL 2, high-voltage transistors are disposed on a silicon substrate layer of an SOI substrate, and an embedded oxide film is used as a gate insulating film.

CITATION LIST

Patent Literature

PTL 1: Japanese Unexamined Patent Application Publication No. 2006-324415
PTL 2: Japanese Unexamined Patent Application Publication No. 2008-085138

SUMMARY OF THE INVENTION

Incidentally, a high-voltage transistor that is able to receive a high voltage equal to or higher than several tens of volts is requested to have a film thickness of about 50 nm or greater from the viewpoint of reliability.

It is desirable to provide a semiconductor device that includes transistors having different withstand voltages and disposed on the same substrate and has high reliability, a method of manufacturing the semiconductor device, and an electronic apparatus.

A semiconductor device according to an embodiment of the present disclosure includes: an SOI substrate in which a silicon substrate layer, a first insulating layer, and a semiconductor layer are layered in this order; a first transistor provided on the semiconductor layer; a second transistor provided on the silicon substrate layer and withstanding a higher voltage than the first transistor; and an element separation film provided between the first transistor and the second transistor, in which the element separation film includes a second insulating layer embedded in an opening that penetrates the semiconductor layer and the first insulating layer and reaches an inside of the silicon substrate layer, and a portion of the second insulating layer constitutes a gate insulating film of the second transistor.

A method of manufacturing a semiconductor device according to an embodiment of the present disclosure includes: forming an opening in an SOI substrate in which a silicon substrate layer, a first insulating layer, and a semiconductor layer are layered in this order, in which the opening penetrates the semiconductor layer and the first insulating layer and reaches an inside of the silicon substrate layer; forming an element separation film by embedding a second insulating layer in the opening; forming a first transistor on the semiconductor layer; and forming a second transistor on the silicon substrate with a portion of the second insulating layer being used as a gate insulating film and with the element separation film being disposed between the first transistor and the second transistor, in which the second transistor withstands a higher voltage than the first transistor.

An electronic apparatus according to an embodiment of the present disclosure includes the semiconductor device according to the embodiment of the present disclosure described above.

In the semiconductor device according to the embodiment of the present disclosure, the method of manufacturing the semiconductor device according to the embodiment of the present disclosure, and the electronic apparatus according to the embodiment of the present disclosure, the opening is provided in the SOI substrate including the first transistor and the second transistor withstanding a higher voltage than the first transistor. The opening penetrates the semiconductor layer and the first insulating layer that constitute the SOI substrate, and reaches the silicon substrate layer. This opening is filled with the second insulating layer to form the element separation film. In addition, a portion of the second insulating layer is used as the gate insulating film of the second transistor. This enables the gate insulating film of the second transistor withstanding a higher voltage to have a sufficient thickness.

According to the semiconductor device of the embodiment of the present disclosure, the method of manufacturing the semiconductor device of the embodiment of the present disclosure, and the electronic apparatus of the embodiment of the present disclosure, the element separation film is provided that has a film thickness greater than that of the first insulating layer constituting the SOI substrate, and a portion of the second insulating layer constituting the element separation film is used as the gate insulating film of the second transistor withstanding a high voltage. This makes it possible to form a second transistor having a sufficient voltage withstanding performance on the SOI substrate. Thus, it is possible to provide a semiconductor device with high reliability that includes transistors having different withstand voltages on the same substrate as well as an electronic apparatus including the semiconductor device.

It is to be noted that effects described here are not necessarily limited, and may include any of effects described in the present disclosure.

BRIEF DESCRIPTION OF THE DRAWINGS

FIG. 1 is a schematic view of a cross-sectional configuration of a semiconductor device according to a first embodiment of the present disclosure.

FIG. 2A is a cross-sectional schematic view that describes a manufacturing method of a method of manufacturing the semiconductor device illustrated in FIG. 1.

FIG. 2B is a cross-sectional schematic view illustrating a step subsequent to FIG. 2A.

FIG. 2C is a cross-sectional schematic view illustrating a step subsequent to FIG. 2B.

FIG. 2D is a cross-sectional schematic view illustrating a step subsequent to FIG. 2C.

FIG. 3A is a cross-sectional schematic view illustrating a step subsequent to FIG. 2D.

FIG. 3B is a cross-sectional schematic view illustrating a step subsequent to FIG. 3A.

FIG. 3C is a cross-sectional schematic view illustrating a step subsequent to FIG. 3B.

FIG. 4A is a cross-sectional schematic view illustrating a step subsequent to FIG. 3C.

FIG. 4B is a cross-sectional schematic view illustrating a step subsequent to FIG. 4A.

FIG. 4C is a cross-sectional schematic view illustrating a step subsequent to FIG. 4B.

FIG. 5A is a cross-sectional schematic view illustrating a step subsequent to FIG. 4C.

FIG. 5B is a cross-sectional schematic view illustrating a step subsequent to FIG. 5A.

FIG. 5C is a cross-sectional schematic view illustrating a step subsequent to FIG. 5B.

FIG. 6A is a cross-sectional schematic view illustrating a step subsequent to FIG. 5C.

FIG. 6B is a cross-sectional schematic view illustrating a step subsequent to FIG. 6A.

FIG. 7A is a cross-sectional schematic view that describes a typical SiO2 film made into a thicker film.

FIG. 7B is a cross-sectional schematic view illustrating a step subsequent to FIG. 7A.

FIG. 7C is a cross-sectional schematic view illustrating a step subsequent to FIG. 7B.

FIG. 8A is a cross-sectional schematic view that describes a method of manufacturing a semiconductor device according to a second embodiment of the present disclosure.

FIG. 8B is a cross-sectional schematic view illustrating a step subsequent to FIG. 8A.

FIG. 8C is a cross-sectional schematic view illustrating a step subsequent to FIG. 8B.

FIG. 8D is a cross-sectional schematic view illustrating a step subsequent to FIG. 8C.

FIG. 9 is a schematic view illustrating a cross-sectional configuration of a semiconductor device according to Modification Example 1 of the present disclosure.

FIG. 10A is a cross-sectional schematic view that describes a method of manufacturing a semiconductor device according to Modification Example 2 of the present disclosure.

FIG. 10B is a cross-sectional schematic view illustrating a step subsequent to FIG. 10A.

FIG. 10C is a cross-sectional schematic view illustrating a step subsequent to FIG. 10B.

FIG. 11A is a cross-sectional schematic view illustrating a step subsequent to FIG. 10C.

FIG. 11B is a cross-sectional schematic view illustrating a step subsequent to FIG. 11A.

FIG. 11C is a cross-sectional schematic view illustrating a step subsequent to FIG. 11B.

FIG. 12A is a cross-sectional schematic view illustrating a step subsequent to FIG. 11C.

FIG. 12B is a cross-sectional schematic view illustrating a step subsequent to FIG. 12A.

FIG. 12C is a cross-sectional schematic view illustrating a step subsequent to FIG. 12B.

FIG. 13A is a cross-sectional schematic view illustrating a step subsequent to FIG. 12C.

FIG. 13B is a cross-sectional schematic view illustrating a step subsequent to FIG. 13A.

FIG. 13C is a cross-sectional schematic view illustrating a step subsequent to FIG. 13B.

FIG. 14A is a cross-sectional schematic view illustrating a step subsequent to FIG. 13C.

FIG. 14B is a cross-sectional schematic view illustrating a step subsequent to FIG. 14A.

FIG. 14C is a cross-sectional schematic view illustrating a step subsequent to FIG. 14B.

FIG. 15A is a cross-sectional schematic view that describes a method of manufacturing a semiconductor device according to Modification Example 3 of the present disclosure.

FIG. 15B is a cross-sectional schematic view illustrating a step subsequent to FIG. 15A.

FIG. 15C is a cross-sectional schematic view illustrating a step subsequent to FIG. 15B.

FIG. 16A is a cross-sectional schematic view illustrating a step subsequent to FIG. 15C.

FIG. 16B is a cross-sectional schematic view illustrating a step subsequent to FIG. 16A.

FIG. 17 is a block diagram illustrating a configuration of an imaging unit that uses, as a pixel, an imaging element including the semiconductor device illustrated in FIG. 1, etc.

FIG. 18 is a functional block diagram illustrating an example of an electronic apparatus (camera) that uses the imaging unit illustrated in FIGS. 11A, 11B, and 11C.

FIG. 19 is a block diagram depicting an example of a schematic configuration of an in-vivo information acquisition system.

FIG. 20 is a block diagram depicting an example of schematic configuration of a vehicle control system.

FIG. 21 is a diagram of assistance in explaining an example of installation positions of an imaging section.

MODES FOR CARRYING OUT THE INVENTION

In the following, embodiments of the present disclosure are described in detail with reference to the drawings. It is to be noted that description is made in the following order.

1. First Embodiment (An example in which an element separation film having a film thickness greater than a BOX layer is formed, and a portion of the element separation film is used as a gate insulating film of a high-voltage transistor)
    1-1. Configuration of Semiconductor Device
    1-2. Method of Manufacturing Semiconductor Device
    1-3. Workings and Effects 2. Second Embodiment (An example in which a gate electrode is formed only using a resist film)
3. Modification Examples
   3-1. Modification Example 1 (An example in which openings having different depths are provided for an element separation film part and a gate insulating film part)
   3-2. Modification Example 2 (A modification example of the first embodiment)
   3-3. Modification Example 3 (A modification example of the second embodiment)
4. Application Examples

1. FIRST EMBODIMENT

FIG. 1 illustrates a cross-sectional configuration of a semiconductor device (semiconductor device 1) according to a first embodiment of the present disclosure. The semiconductor device 1 includes transistors (a first transistor and a second transistor) having different withstand voltages on the same substrate, and is used in a distance-measuring image sensor, a microcomputer, or the like using, for example, single photon avalanche diode (SPAD). The semiconductor device 1 includes an advanced transistor (transistor 10), which is, for example, a transistor in the 22-nm generation or later, and a transistor (transistor 20) that is able to receive a high voltage, for example, equal to or higher than several tens of volts. The transistors 10 and 20 are mounted on a single SOI substrate 11 in a mixed manner. The SOI substrate 11 has a configuration in which a silicon substrate layer 12, an insulating layer 13 (first insulating layer), and a semiconductor layer 14 are layered in this order. In the present embodiment, the transistor 10 is provided on the semiconductor layer 14 that constitutes the SOI substrate 11, and the transistor 20 is provided on the silicon substrate layer 12 that constitutes the SOI substrate 11. An element separation film 21A is provided between the transistor 10 and the transistor 20, and has a film thickness (hereinafter, simply referred to as a thickness), in the Y axis direction, thicker than that of the insulating layer 13. A portion of an insulating layer 21 (see, for example, FIG. 3C) that constitutes the element separation film 21A is used as a gate insulating film 21B of the transistor 20.

(1-1. Configuration of Semiconductor Device)

As described above, the semiconductor device 1 has a configuration in which the transistor 10, which is an advanced transistor, and the transistor 20 that is able to receive a high voltage of, for example, several tens of volts or higher, are provided on the SOI substrate 11, with the element separation film 21A being interposed therebetween.

The SOI substrate 11 has a configuration in which the insulating layer 13 and the semiconductor layer 14 are layered in this order on the silicon substrate layer 12 including a bulk silicon. The insulating layer 13 is called a so-called BOX layer, and includes a silicon oxide film ($SiO_2$ film) of, for example, 20 nm or less. The semiconductor layer 14 includes a silicon single crystal layer of, for example, 6 nm or less.

The transistor 10 is an advanced transistor in the 22-nm generation or later as described above, and is, for example, a fully depleted silicon-on-insulator (FD-SOI) transistor. The transistor 10 has a planar transistor structure. The transistor 10 includes a gate electrode 15 disposed on the semiconductor layer 14. It is to be noted that a gate insulating film including, for example, hafnium oxide ($HfO_2$), etc. is provided between the gate electrode 15 and the semiconductor layer 14, although not illustrated. The gate electrode 15 has a side surface provided with a side wall 16 including, for example, a silicon nitride film. The semiconductor layer 14, which faces the gate electrode 15, includes a channel region 14C. A source region 14S and a drain region 14D are provided on respective sides of the channel region 14C, and impurities are diffused in each of the source region 14S and the drain region 14D. For example, in a case where the transistor 10 is an NMOS transistor, phosphorus (P) in a dose amount of ion implantation of, for example, $1E18/cm^2$ to $1E19/cm^2$ is diffused for the source region 14S and the drain region 14D. In a case where the transistor 10 is, for example, a PMOS transistor, boron (B) in, for example, $1E18/cm^2$ to $1E19/cm^2$ is diffused for the source region 14S and the drain region 14D.

The transistor 20 is a so-called high-voltage transistor that is able to receive a high voltage, for example, in a range from over ten volts to 20 volts or higher, as described above. The transistor 20 is a silicon planar transistor, and includes, for example, a gate electrode 22; a source region 23S and a drain region 23D, each of which is provided on the silicon substrate layer 12; and the gate insulating film 21B provided between the silicon substrate layer 12 and the gate electrode 22.

The gate electrode 22 is provided above the silicon substrate layer 12. However, the gate insulating film 21B is provided between the gate electrode 22 and the silicon substrate layer 12, as described above. This gate insulating film 21B includes, for example, an $SiO_2$ film, etc., and has a thickness (W2) greater than a thickness (W1) of the BOX layer (insulating layer 13) of the SOI substrate 11. A side wall 24 including, for example, silicon nitride is provided on a side surface of the gate electrode 22. It is to be noted that the side wall 24 is provided on the silicon substrate layer 12, and is formed continuously on respective side surfaces of the gate electrode 22 and the gate insulating film 21B.

The source region 23S and the drain region 23D are provided at respective sides of a channel region opposed to the gate electrode 22, and impurities are diffused in the silicon substrate layer 12. The source region 23S and the drain region 23D each include, for example, a high-concentration diffusion region 12A having a high diffusion concentration of impurities, and a low-concentration diffusion region 12B provided on the periphery of the high-concentration diffusion region 12A and having a diffusion concentration of impurities lower than that of the high-concentration diffusion region 12A. The high-concentration diffusion region 12A and the low-concentration diffusion region 12B have, for example, the following configuration. For example, in a case where the transistor 20 is an NMOS transistor, phosphorus (P) in a dose amount of ion implantation of, for example, $1E17/cm^2$ to $1E18/cm^2$ is diffused for the high-concentration diffusion region 12A, and phosphorus (P) in a dose amount of ion implantation of, for example, $1E14/cm^2$ to $1E15/cm^2$ is diffused for the low-concentration diffusion region 12B. In addition, for example, in a case where the transistor 20 is, for example, a PMOS transistor, boron (B) in, for example, $1E17/cm^2$ to $1E18/cm^2$ is diffused for the high-concentration diffusion region 12A, and boron (B) in, for example, $1E14/cm^2$ to $1E15/cm^2$ is diffused for the low-concentration diffusion region 12B.

The element separation film 21A is provided between the transistor 10 and the transistor 20, and includes, for example, $SiO_2$. The element separation film 21A has a thickness greater than that of the BOX layer (insulating layer 13) of the SOI substrate 11. Although the details are described later, the element separation film 21A includes, for example, an insulating layer 21 (second insulating layer). The insulating layer 21 (second insulating layer) penetrates the semiconductor layer 14 and the insulating layer 13 of the SOI substrate 11, and fills an opening 12H having a bottom surface provided inside the silicon substrate layer 12. In addition, a protruding part 21X that protrudes into the silicon substrate layer 12 is provided at a portion of the bottom surface of the element separation film 21A. This protruding part 21X may not be necessarily provided in a case where the advanced transistor (transistor 10) and the high voltage transistor (transistor 20) are sufficiently spaced apart from each other (for example, 10 μm or more). However, for example, in a case where a plurality of advanced transistors and a plurality of high voltage transistors are provided on the SOI substrate and the high voltage transistors (transistors 20) are disposed adjacent to each other, the protruding part 21X may be preferably provided on the bottom surface of an element separation film 21A disposed between the adjacent transistors. This improves an insulating property between high voltage transistors, and also makes it possible for high voltage transistors to be disposed close to each other, for example, as close as 1 μm. Thus, it is possible to reduce the area of chips.

The insulating layer 21 is divided by an opening 21H1 and an opening 21H2 as illustrated, for example, in FIG. 5C, and the insulating layer 21 divided by the opening 21H constitutes the element separation film 21A. In addition, the insulating layer 21 divided by the opening 21H1 and the opening 21H2 constitutes the gate insulating film 21B of the transistor 20. It is to be noted that the present embodiment gives an example in which the insulating layer 21 is divided into three parts by the opening 21H1 and the opening 21H2; however, this is not limitative. For example, the insulating layer 21 may be divided into two parts by the opening 21H1 to use one of the divided parts as the element separation film 21A and the other one as the gate insulating film 21B. However, in a case where a plurality of transistors is provided on the SOI substrate 11 as described above, the insulating layer 21 is divided into three parts as in the present embodiment to enable the remaining part of the insulating layer 21 to be used as the element separation film for the adjacent transistors.

(1-2. Method of Manufacturing Semiconductor Device)

A semiconductor device 1 according to the present embodiment may be manufactured, for example, in the following manner.

First, an SOI substrate 11 is prepared, in which the silicon substrate layer 12, the insulating layer 13, and the semiconductor layer 14 are layered in this order, as illustrated in FIG. 2A. Thereafter, as illustrated in FIG. 2B, an oxide film 31 of, for example, 1 nm is formed on the SOI substrate 11 (specifically, on a surface of the semiconductor layer 14), for example, through thermal oxidation. Thereafter, a silicon nitride film (SiN film) 32 of, for example, 30 nm is formed on the oxide film 31, for example, using a low pressure chemical vapor deposition (LPCVD) method.

Next, as illustrated in FIG. 2C, a resist film 33 is formed on the SiN film 32, and thereafter patterning is applied to form an opening 33H. Subsequently, an opening 11H that is to serve as a protruding part 21X and to reache the inside of the silicon substrate layer 12 is formed, for example, through an etching method, as illustrated in FIG. 2D.

Next, after the resist film 33 is removed, patterning of a resist film 34 having an opening 34H including the opening 11H is applied to the SiN film 32 as illustrated in FIG. 3A. Thereafter, an opening 12H that reaches the inside of the silicon substrate layer 12 is formed, for example, through an etching method, as illustrated in FIG. 3B. Next, the resist film 34 is removed, and thereafter, for example, a silicon oxide film (SiO$_2$ film, insulating layer 21) is embedded in the opening 12H using, for example, a high-density plasma chemical vapor deposition (HDP-CVD) method, as illustrated in FIG. 3C. The surface of the insulating layer 21 is subsequently planarized, for example, through a chemical mechanical polishing (CMP) method.

Next, as illustrated in FIG. 4A, etching is performed to the insulating layer 21 using, for example, a wet etching method to adjust the insulating layer 21 to have a given thickness. In the present embodiment, etching is performed, for example, until the layer has a thickness that allows the layer and the semiconductor layer 14 to form the same plane. Subsequently, as illustrated in FIG. 4B, the SiN film 32 and the oxide film 31 are removed, and thereafter, for example, a hafnium oxide film (HfO$_2$ film), which is to serve, for example, as a gate insulating film of the transistor 10, is formed to have a thickness of, for example, 2 nm on the entire surface of the SOI substrate 11, although not illustrated. Thereafter, as illustrated in FIG. 4C, a polysilicon (Si) film 15A is formed on the semiconductor layer 14 of the SOI substrate 11 and the insulating layer 21 (actually, on the HfO$_2$ film), for example, using a CVD method. It is to be noted that, when the poly-Si film 15A is formed, patterning of the HfO$_2$ film may be applied only to a region where the transistor 10 is formed. However, the existence or absence of the HfO$_2$ film does not particularly affect a property of the transistor 20, and hence, the formation may be made on the entire surface of the SOI substrate 11.

Next, as illustrated in FIG. 5A, an SiN film 35 is formed on the poly-Si film 15A, for example, using a CVD method, and thereafter patterning of a resist film 36 is applied to the SiN film 35. Thereafter, as illustrated in FIG. 5B, etching is performed to the SiN film 35 and the poly-Si film 15A, for example, through an etching method. This allows the gate electrodes 15 and 22 of the transistor 10 and the transistor 20 to be collectively formed on the HfO$_2$ film. Subsequently, the resist film 36 is removed, and thereafter patterning of a resist film 37 having an opening containing the gate electrode 22 of the transistor 20 is applied to the SOI substrate 11. Next, as illustrated in FIG. 5C, etching is performed to the insulating layer 21 inside the opening of the resist film 37, for example, using an etching method. At this time, the SiN film 35 on the gate electrode 22 serves as an etching mask, and an opening 21H1 and an opening 21H2 are formed in the insulating layer 21. Accordingly, the insulating layer 21 is divided into three parts: an insulating layer 21 below the gate electrode 22 becomes a gate insulating film 21B of the transistor 20; and an insulating layer 21 divided on side of the transistor 10 becomes the element separation film 21A that electrically separates the transistor 10 and the transistor 20 from each other. Thereafter, the resist film 37 is removed.

Next, a source region 14S and a drain region 14D are formed in the semiconductor layers 14 at both sides of the gate electrode 15 of the transistor 10, for example, using an ion implantation method. Thereafter, as illustrated in FIG. 6A, a low-concentration diffusion region 12B is formed in the silicon substrate layers 12 inside respective openings 21H1 and 21H2, for example, using an ion implantation method. Subsequently, for example, an SiN film is formed, for example, using a CVD method, and thereafter etch back is performed to form side walls 16 on respective side surfaces of the gate electrode 15 of the transistor 10 and also form side walls 24 on respective side surfaces continuing over the gate electrode 22 and the gate insulating film 21B of the transistor 20. At this time, an SiN film having a shape similar to that of the side wall 24 is formed on a side surface of the element separation film 21A and on a side surface of the insulating layer 21 on opposite side across the gate insulating film 21B; the side surface of the element separation film 21B and the side surface of the insulating layer 21 respectively constitute the openings 21H1 and 21H2. Thereafter, high-concentration diffusion regions 12A are formed in the silicon substrate layers 12 inside respective openings 21H1 and 21H2, for example, using an ion implantation method. At this time, the SiN films formed on the side wall 24, the side surface of the element separation film 21A, and the side surface of the insulating layer 21 on the opposite side across the gate insulating film 21B each serve as a mask, and the high-concentration diffusion region 12A is formed inside the low-concentration diffusion region 12B that has previously been formed. This allows the semiconductor device 1 illustrated in FIG. 1 to be obtained.

It is to be noted that the semiconductor device 1 according to the present embodiment is used, for example, in a distance-measuring image sensor, etc., as described above. For example, in an imaging unit 4 illustrated in FIG. 17, a pixel section 50 including a photoelectric conversion part is disposed on the semiconductor device 1 illustrated in FIG. 1. A plurality of unit pixels P is disposed in the pixel section 50 in matrix. For example, each of the unit pixels P includes the transistor 10 and the transistor 20. In this case, an interlayer insulating layer 41 including, for example, a silicon oxide film or a silicon oxide film containing phosphorus or boron is formed on the semiconductor device 1, for example, using a CVD method, and thereafter, contact plugs P1, P2, P3, P4, P5, and P6 are formed in the interlayer insulating layer 41, as illustrated in FIG. 6B. One ends of the contact plugs P1, P2, P3, P4, P5, and P6 are electrically coupled to the gate electrode 15, the source region 14S, and the drain region 14D of the transistor 10, and the gate electrode 22, the source region 23S, and the drain region 23D of the transistor 20, respectively, as illustrated in FIG. 6B. The other ends thereof are coupled to predetermined locations of the unit pixel P.

[1-3. Workings and Effects]

In a case where transistors having different withstand voltages are disposed on the same substrate, gate insulating films for a low-voltage operating transistor and for a high-voltage operating transistor are typically made separately using a multi-oxide process. Specifically, thick-film oxidation is first applied to a silicon substrate 101 to form an SiO$_2$ film 102, as illustrated in FIG. 7A. Thereafter, the SiO$_2$ film 102 in a predetermined region (for example, region where the low-voltage operating transistor is formed) is removed as illustrated in FIG. 7B. Thereafter, thin-film oxidation is applied to the silicon substrate 101 as illustrated in FIG. 7C, thereby forming, above the silicon substrate 101, SiO$_2$ films 102 having different thicknesses.

Incidentally, in a distance-measuring image sensors using, for example, SPAD, an advanced transistor, for example, in the 22-nm generation or later (for example, FD-SOI transistor) and a transistor (high-voltage transistor) that is able to receive a high voltage of several tens of volts or higher are used, as described above. The FD-SOI transistor is formed on the SOI substrate in which a thin Si layer is disposed above a silicon substrate with an insulating layer (BOX layer) interposed therebetween. In a case where a high-voltage transistor is disposed on this SOI substrate in a mixed manner using the method described above, the entire Si layer is oxidized at the time of thick-film oxidation.

Furthermore, as described above, a method of using the BOX layer of the SOI substrate as a gate insulating film for the high voltage transistor has been considered. However, from the viewpoint of reliability, the gate insulating film for a high-voltage transistor, which is able to receive a high voltage of several tens of volts or higher, is requested to have a thickness, for example, of 50 nm or greater. Typically, voltage resistance is not sufficient when the BOX layer of about 20 nm is used as a gate insulating film for the high voltage transistor. Under such a circumstance, it is conceivable to increase the thickness of the BOX layer (for example, about 50 nm). In such a case, however, back-bias control that is performed in the FD-SOI transistor may not be performed.

In addition, it may be possible to consider a method of making the BOX layer partially have a thick film using a local oxidation of silicon (LOCOS) method. However, in a case where the BOX layer is made into a thick film using the LOCOS method, volume expansion occurs in the vicinity of the thickened film due to local thermal oxidation, which results in formation of a step on a surface of the SOI substrate. Incidentally, in semiconductor devices having finer design, depth of focus (DOF) is reduced in a lithography process. Thus, dispersion is more likely to occur in the width of line of the resist film formed through the lithography process. In order to suppress this dispersion, it is desirable to reduce the step of the base on which the resist film is formed. Meanwhile, the step on the surface of the SOI substrate generated through local thermal oxidation in the LOCOS method serves as one factor that causes the dispersion in the width of line of the resist film.

In the present embodiment, the opening 12H that penetrates the semiconductor layer 14 and the insulating layer 13, which constitute the SOI substrate 11, and reaches the silicon substrate layer 12 is formed as the element separation film 21A in the SOI substrate 11. The insulating layer 21 is embedded in the opening 12H, and a portion of the insulating layer 21 is used as the gate insulating film 21B for the high voltage transistor (transistor 20). By adjusting the depth of the opening 12H, it is possible to set a thickness of the insulating layer 21 in a given manner. This enables the gate insulating film 21B of the transistor 20 withstanding a high voltage to have a sufficient thickness without affecting the operation of the transistor 10 that is an advanced transistor and without affecting the manufacturing processes.

As described above, the semiconductor device 1 according to the present embodiment has a configuration in which: the element separation film 21A having a film thickness greater than that of the insulating layer 13 constituting the SOI substrate 11 is disposed between the transistor 10, which is an FD-SOI transistor, and the transistor 20, which is a high voltage transistor; and a portion of the insulating layer 21 constituting the element separation film 21A is used as a gate insulating film of the transistor 20. Specifically, the opening 12H that penetrates the semiconductor layer 14 and the insulating layer 13 and reaches the inside of the silicon substrate layer 12 is provided in the SOI substrate 11. The insulating layer 21 is embedded in the opening 12H, and the insulating layer 21 is divided. One of the divided insulating layer 21 is used as the element separation film 21A, and the other thereof is used as the gate insulating film for the transistor 20. This makes it possible to form the gate insulating film 21B having a sufficient voltage withstanding performance as a gate insulating film for the transistor 20 that is a high voltage transistor. Thus, it is possible to provide the semiconductor device 1 with high reliability that includes transistors having different withstanding voltages on the same substrate.

In addition, the protruding part 21X that protrudes into the silicon substrate layer 12 is provided at the bottom surface of the element separation film 21A. This improves an electrical insulating property between the transistor 10 and the transistor 20, thereby making it possible to reduce the distance between the transistor 10 and the transistor 20. Furthermore, in a case where a plurality of transistors 20 is adjacently disposed, the protruding part 21X may be provided therebetween, which makes it possible to reduce the distance between the transistors 20. Thus, it is possible to reduce the chip area.

In the following, a second embodiment and Modification Examples 1 to 3 according to the present disclosure are described. It is to be noted that the same reference numerals are given to the same components as those in the first embodiment described above, and descriptions thereof are omitted.

2. SECOND EMBODIMENT

FIGS. 8A and 8B schematically illustrate another example of a method of manufacturing a semiconductor device 1 according to a second embodiment of the present disclosure.

The manufacturing method according to the present embodiment uses the method described in the foregoing first embodiment to form a poly-Si film 15A on the SOI substrate 11 as illustrated in FIG. 8A. Thereafter, as illustrated in FIG. 8B, patterning of the resist film 36 is applied on the Si film 15A without forming the SiN film 35. Subsequently, as illustrated in FIG. 8C, etching is performed to the poly-Si film 15A using the resist film 36 as a mask to form the gate electrode 15 of the transistor 10 and the gate electrode 22 of the transistor 20. Thereafter, the resist film 36 is removed. Next, as illustrated in FIG. 8D, patterning of a resist film 38 is applied to the semiconductor layer 14 of the SOI substrate 11 and the insulating layer 21, and thereafter etching is performed to the insulating layer 21 using a method similar to that used in the first embodiment. In this manner, the opening 21H1 and the opening 21H2 are formed in the insulating layer 21, and the insulating layer 21 is divided into three parts. Thereafter, a method similar to that used in the first embodiment is used to thereby obtain the semiconductor device 1 illustrated in FIG. 1.

In the present embodiment, the semiconductor device 1 is formed without forming the SiN film 35 to serve as a mask at the time of etching of the insulating layer 21 that forms the opening 21H1 and the opening 21H2. This makes it possible to reduce the number of manufacturing processes, as compared with the method of manufacturing the semiconductor device 1 according to the first embodiment described above.

3. MODIFICATION EXAMPLES

3-1. Modification Example 1

FIG. 9 illustrates a cross-sectional configuration of a semiconductor device (semiconductor device 2) according to Modification Example 1 of the present disclosure. In the semiconductor device 2 according to the present modification example, an opening 12H having a plurality of depths (here, three depths) is formed, and an insulating layer 21 having steps on the bottom surface thereof is provided. Specifically, the element separation film 21A has a thickness greater than that of the gate insulating film 21B, with the protruding part 21X described in the first embodiment being interposed therebetween. As described above, it is possible to adjust the thicknesses of the element separation film 21A and the gate insulating film 21B appropriately.

3-2. Modification Example 2

FIGS. 10A, 10B, 10C, 11A, 11B, 11C, 12A, 12B, 12C, 13A, 13B, 13C, 14A, 14B, and 14C illustrate a method of manufacturing a semiconductor device (semiconductor device 3, see FIG. 14C) according to a modification example of the first embodiment described above. The semiconductor device 3 according to the present modification example has a configuration in which a plurality of transistors 10 and a plurality of transistor 20 (two transistors 10, i.e., transistors 10X and 10Y and two transistors 20, i.e., transistors 20X and 20Y in the present modification example) are provided on the SOI substrate 11. Such a semiconductor device 3 may be manufactured, for example, in the following manner.

First, an oxide film 31 and an SiN film 32 are formed on the SOI substrate 11, for example, using a method similar to that used in the first embodiment. Thereafter, as illustrated in FIG. 10A, a resist film 33 is formed on the SiN film 32, and patterning is applied to form, for example, four openings 33H1 to 33H4. Subsequently, as illustrated in FIG. 10B, openings 11H1 to 11H4 that reach the inside of the silicon substrate layer 12 are formed, for example, through an etching method. Subsequently, the resist film 33 is removed, and thereafter patterning of the resist film 34 having an opening in a region 20R where the transistors 20X and 20Y are formed is applied to the SiN film 32 as illustrated in FIG. 10C.

Next, an opening 12H that reaches the inside of the silicon substrate layer 12 is formed, for example, through an etching method, as illustrated in FIG. 11A. Subsequently, the resist film 34 is removed, and thereafter, for example, an SiO$_2$ film (insulating layer 21) is formed in the openings 11H1 and 11H2, in the opening 12H including the openings 11H3 and 11H4, and on the SiN film 32, for example, using an HDP-CVD method, as illustrated in FIG. 11B. Thereafter, the surface of the insulating layer 21 is planarized, for example, through a CMP method, as illustrated in FIG. 11C. This forms protruding parts 21X1, 21X2, 21X3, and 21X4 that allow the transistors 10X and 10Y and the transistors 20X and 20Y that are eventually disposed adjacent to each other, to be electrically insulated from each other.

Subsequently, as illustrated in FIG. 12A, the insulating layer 21 is adjusted to have a given thickness, for example, using a wet etching method, and thereafter, the SiN film 32 and the oxide film 31 are removed. Next, although no illustration is given, for example, an HfO$_2$ film having a thickness of, for example, 2 nm and serving, for example, as a gate insulating film for the transistor 10 is formed on the entire surface of the SOI substrate 11 similarly to the first embodiment. Thereafter, a polysilicon (Si) film 15A and the SiN film 35 are formed in this order, for example, using a CVD method as illustrated in FIG. 12B. Thereafter, patterning of the resist film 36 is applied to the SiN film 35 as illustrated in FIG. 12C.

Next, etching is performed to the SiN film 35 and the poly-Si film 15A, for example, through an etching method with the resist film 36 being used as a mask, as illustrated in FIG. 13A. This allows the gate electrodes 15X, 15Y, 22X, and 22Y of the transistors 10X and 10Y and the transistors 20X and 20Y to be collectively formed. Subsequently, the resist film 36 is removed, and thereafter patterning of a resist film 37 is applied to the semiconductor layer 14 of the SOI substrate 11 and the insulating layer 21, as illustrated in FIG. 13B. Next, etching is performed to the insulating layer 21, for example, using an etching method. At this time, the SiN film 35 on the gate electrode 22, together with the resist film 37, serves as an etching mask, and openings 21H1, 21H2, 21H3, and 21H4 are formed. This cause the insulating layer 21 inside the opening 12H to be divided into five parts: the gate insulating films 21B1 and 21B2 of the transistors 20X and 20Y; the element separation film 21A that electrically separates the transistor 10 and the transistor 20 from each other; an element separation film (insulating film 21B3) that electrically insulates the transistor 20X and the transistor 20Y from each other; and, for example, an element separation film (insulating film 21B4) when another transistor is formed on side of the transistor 20Y opposite to the transistor 20X, although illustration is not given. Subsequently, as illustrated in FIG. 13C, the resist film 37 and the SiN film 35 provided on each of the gate electrodes 15X, 15Y, 22X, and 22Y are removed.

Next, source regions 14S1, 14S2 and drain regions 14D1, 14D2 are formed in the semiconductor layers 14 at respective both sides of the transistors 10X and 10Y, for example, using an ion implantation method. Thereafter, as illustrated in FIG. 14A, a resist film 39 is formed on the semiconductor layer 14 including the transistors 10X and 10Y and the element separation film 21A. Subsequently, low-concentration diffusion regions 12B1 and 12B2 are formed on the silicon substrate layer 12 inside the openings 21H1 and 21H2 and the silicon substrate layer 12 inside the openings 21H3 and 21H4, respectively, for example, using an ion implantation method. Next, the resist film 39 is removed, and thereafter, for example, an SiN film is formed, for example, using a CVD method, and etch back is performed to form side walls 16 on respective side surfaces of the gate electrode 15X and 15Y of the transistor 10X and 10Y and also form side walls 24 on respective side surfaces continuing over the gate electrode 22X and the gate insulating film 21B1 of the transistor 20X and on respective side surfaces continuing over the gate electrode 22Y and the gate insulating film 21B2 of the transistor 20Y, as illustrated in FIG. 14B. At this time, an SiN film having a shape similar to that of the side wall is formed on a side surface of the element separation film 21A and side surfaces of the insulating films 21B3 and 21B4 to serve as element separation films between the transistors. Thereafter, a resist film 40 is formed again on the semiconductor layer 14 including the transistors 10X and 10Y and on the element separation film 21A. Next, high-concentration diffusion regions 12A1 and 12A2 are formed on the silicon substrate layers 12 inside the openings 21H1, 21H2, 21H3, and 21H4, for example, using an ion implantation method, as illustrated in FIG. 14C. At this time, the side wall 24 and the SiN films formed on the side surfaces of the element separation film 21A and the insulating films 21B3 and 21B4 each serve as a mask, and the high-concentration diffusion regions 12A1 and 12A2 are formed inside the low-concentration diffusion regions 12B1 and 12B2 that have previously been formed. Lastly, the resist film 40 is removed to obtain the semiconductor device 3 that includes protruding parts 21X1, 21X2 and 21X3, and 21X4 disposed between the transistor 10X and the transistor 10Y adjacent to each other, between the transistor 10Y and the transistor 20X, and between the transistor 20X and the transistor 20Y, respectively.

It is to be noted that description here gives an example in which two protruding parts 21X2 and 21X3 are provided between the transistor 10Y and the transistor 20X. However, the protruding part 21X2 may be omitted, as long as at least the protruding part 21X3 having a tip thereof located at a deeper position is formed between the advanced transistor (transistor 10Y) and the high voltage transistor (transistor 20X).

3-3. Modification Example 3

FIGS. 15A, 15B, 15C, 16A, and 16B illustrate a method of manufacturing a semiconductor device 3 according to a modification example of the foregoing second embodiment. In the present modification example, the semiconductor device 3 may be manufactured, for example, in the following manner.

First, the protruding parts 21X1, 21X2, 21X3, and 21X4 are formed using a method similar to that used in Modification Example 1. Thereafter, as illustrated in FIG. 15A, a polysilicon (Si) film 15A is formed on the semiconductor layer 14 of the SOI substrate 11 and the insulating layer 21 (actually, on the $HfO_2$ film), for example, using a CVD method. Thereafter, patterning of the resist film 36 is applied to the Si film 15A as illustrated in FIG. 15B. Thereafter, as illustrated in FIG. 15C, etching is performed to the poly-Si film 15A using the resist film 36 as a mask to form respective gate electrodes 15X and 15Y of the transistors 10X and 10Y and respective gate electrodes 22X and 22Y of the transistors 20X and 20Y.

Next, the resist film 36 is removed, and thereafter patterning of the resist film 38 is applied to the semiconductor layer 14 of the SOI substrate 11 and the insulating layer 21. Thereafter, etching is performed to the insulating layer 21 using a method similar to that used in the first embodiment to form the openings 21H1, 21H2, 21H3, and 21H4 as illustrated in in FIG. 16B. Thereafter, a method similar to that used in Modification Example 1 is used to obtain the semiconductor device 3 illustrated in FIG. 14C.

4. APPLICATION EXAMPLES

Application Example 1

FIG. 17 illustrates the entire configuration of an imaging unit (imaging unit 4) using, for each unit pixel P, an imaging element including the semiconductor device (semiconductor device 1 or 2) described in the first embodiment (or the modification example) described above. This imaging unit 4 is a CMOS image sensor, and includes, for example, a pixel section 50 disposed on the SOI substrate 11 and serving as an i area. The imaging unit 4 also includes, in a peripheral region of the pixel section 50, a peripheral circuit section 130 including, for example, a row scanner 131, a horizontal selector 133, a column scanner 134, and a system controller 132.

The pixel section 50 includes, for example, a plurality of unit pixels P (corresponding to imaging elements) arranged two-dimensionally in matrix. For example, a pixel drive line Lread (specifically, a row selection line and a reset control line) is wired to the unit pixel P for each pixel row, and a vertical signal line Lsig is wired to the unit pixel P for each pixel column. The pixel drive line Lread is used to transmit drive signals for reading of signals from a pixel. One end of the pixel drive line Lread is coupled to an output terminal corresponding to each row of the row scanner 131.

The row scanner 131 includes a shift register, an address decoder, etc., and is a pixel driver that drives individual unit pixels P of the pixel section 50, for example, on a row basis. Signals outputted from the individual unit pixels P in a pixel row selectively scanned by the row scanner 131 pass through individual vertical signal lines Lsig, and are supplied to the horizontal selector 133. The horizontal selector 133 includes an amplifier, a horizontal selecting switch, etc. provided for each vertical signal line Lsig.

The column scanner 134 includes a shift register, an address decoder, etc., and sequentially drives individual horizontal selecting switches of the horizontal selector 133 while scanning the individual horizontal selecting switches. This selective scanning by the column scanner 134 causes signals of each pixel transmitted through individual vertical signal lines Lsig to be outputted sequentially to horizontal signal lines 135 and to be transmitted through the horizontal signal lines 135 to the outside of the SOI substrate 11.

The circuit part including the row scanner 131, the horizontal selector 133, the column scanner 134, and the horizontal signal lines 135 may be formed directly on the SOI substrate 11 or may be disposed in an external control IC. In addition, such a circuit part may be formed on another substrate coupled by means of, for example, a cable.

The system controller 132 receives, for example, a clock given from the outside of the SOI substrate 11, and data used to instruct operation modes, and also outputs data such as internal information concerning the imaging unit 4. The system controller 132 further includes a timing generator that generates various timing signals, and controls driving of peripheral circuits such as the row scanner 131, the horizontal selector 133, and the column scanner 134, on the basis of various timing signals generated by this timing generator.

Application Example 2

The imaging unit 4 described above is applicable, for example, to various types of electronic apparatuses that have imaging functions, such as a camera system including a digital still camera and a video camera, and mobile phones that have imaging functions. FIG. 18 illustrates a schematic configuration of an electronic apparatus 5 (camera) as one example of the electronic apparatuses. This electronic apparatus 5 is, for example, a video camera that is able to photograph a still image or a moving image. The electronic apparatus 5 includes the imaging unit 4, an optical system (optical lens) 310, a shutter device 311, a drive section 313 that drives the imaging unit 4 and the shutter device 311, and a signal processing section 312.

The optical system 310 guides image light (incident light) from a subject to the pixel section 50 of the imaging unit 4. This optical system 310 may include a plurality of optical lenses. The shutter device 311 controls periods of light irradiation and light shielding with respect to the imaging unit 4. The drive section 313 controls a transfer operation of the imaging unit 4 and a shutter operation of the shutter device 311. The signal processing section 312 performs various signal processings on a signal outputted from the imaging unit 4. An image signal Dout after the signal processing is stored in a storage medium such as a memory, or is outputted to a monitor, etc.

Furthermore, the imaging unit 4 described above is also applicable to an electronic apparatus described below (a capsule type endoscope 10100 and a mobile body such as a vehicle).

Application Example 3

<Practical Application Example to In-Vivo Information Acquisition System>

FIG. 19 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 19, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to an embodiment of the present disclosure can be applied. The technology according to an embodiment of the present disclosure is applicable to, for example, the image pickup unit 10112 of the configurations described above. This makes it possible to acquire a fine operative image, thereby improving accuracy of an inspection.

Application Example 4

<Practical Application Example to Mobile Body>

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Description has been made hereinabove with reference to the first and second embodiments and Modification Examples 1 to 3. However, contents of the present disclosure are not limited to these embodiments, etc., and may be modified in a variety of ways.

It is to be noted that the semiconductor device, the method of manufacturing the semiconductor device, and the electronic apparatus according to the present disclosure may have the following configurations.

(1)

A semiconductor device including:

an SOI substrate in which a silicon substrate layer, a first insulating layer, and a semiconductor layer are layered in this order;

a first transistor provided on the semiconductor layer;

a second transistor provided on the silicon substrate layer and withstanding a higher voltage than the first transistor; and an element separation film provided between the first transistor and the second transistor, the element separation film including a second insulating layer embedded in an opening, the opening penetrating the semiconductor layer and the first insulating layer and reaching an inside of the silicon substrate layer, and a portion of the second insulating layer constituting a gate insulating film of the second transistor.

(2)

The semiconductor device according to (1), in which the second insulating layer has a thickness in a layered direction greater than a thickness of the first insulating layer.

(3)

The semiconductor device according to (1) or (2), in which the element separation film has a protruding part that protrudes into the silicon substrate layer.

(4)

The semiconductor device according to any one of (1) to (3), in which the first transistor includes a fully depleted transistor.

(5)

The semiconductor device according to any one of (1) to (4), in which a gate electrode of the first transistor and a gate electrode of the second transistor are formed on same layer.

(6)

A method of manufacturing a semiconductor device, the method including:

forming an opening in an SOI substrate in which a silicon substrate layer, a first insulating layer, and a semiconductor layer are layered in this order, the opening penetrating the semiconductor layer and the first insulating layer and reaching an inside of the silicon substrate layer;

forming an element separation film by embedding a second insulating layer in the opening;

forming a first transistor on the semiconductor layer; and forming a second transistor on the silicon substrate layer, with a portion of the second insulating layer being used as a gate insulating film and with the element separation film being disposed between the first transistor and the second transistor, the second transistor withstanding a higher voltage than the first transistor.

(7)

The method of manufacturing the semiconductor device according to (6), further including collectively forming a gate electrode of the first transistor and a gate electrode of the second transistor, respectively, on the semiconductor layer and the second insulating layer after formation of the second insulating layer.

(8)

The method of manufacturing the semiconductor device according to (6) or (7), further including forming a protruding part that protrudes toward side of the silicon substrate layer inside a formation region of the opening before the forming of the opening in the SOI substrate.

(9)

The method of manufacturing the semiconductor device according to (7) or (8), further including separating the second transistor to form the element separation film and the gate insulating film of the second transistor after the forming of the gate electrode of the first transistor and the gate electrode of the second transistor.

(10)

An electronic apparatus including a semiconductor device, the semiconductor device including an SOI substrate in which a silicon substrate layer, a first insulating layer, and a semiconductor layer are layered in this order, a first transistor provided on the semiconductor layer, a second transistor provided on the silicon substrate layer, and an element separation film provided between the first transistor and the second transistor, the element separation film including a second insulating layer embedded in an opening, the opening penetrating the semiconductor layer and the first insulating layer and reaching an inside of the silicon substrate layer, and a portion of the second insulating layer constituting a gate insulating film of the second transistor.

This application claims the benefit of Japanese Patent Application JP2017-040702 filed with the Japan Patent Office on Mar. 3, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device, comprising:
an SOI substrate in which a silicon substrate layer, a first insulating layer, and a semiconductor layer are layered in this order;
a first transistor provided on the semiconductor layer;
a second transistor provided on the silicon substrate layer and withstanding a higher voltage than the first transistor; and
an element separation film provided between the first transistor and the second transistor,
the element separation film including a second insulating layer embedded in an opening, the opening penetrating the semiconductor layer and the first insulating layer and reaching an inside of the silicon substrate layer, and
a portion of the second insulating layer constituting a gate insulating film of the second transistor.

2. The semiconductor device according to claim 1, wherein the second insulating layer has a thickness in a layered direction greater than a thickness of the first insulating layer.

3. The semiconductor device according to claim 1, wherein the element separation film has a protruding part that protrudes into the silicon substrate layer.

4. The semiconductor device according to claim 1, wherein the first transistor comprises a fully depleted transistor.

5. The semiconductor device according to claim 1, wherein a gate electrode of the first transistor and a gate electrode of the second transistor are formed on same layer.

6. A method of manufacturing a semiconductor device, the method comprising:
forming an opening in an SOI substrate in which a silicon substrate layer, a first insulating layer, and a semiconductor layer are layered in this order, the opening penetrating the semiconductor layer and the first insulating layer and reaching an inside of the silicon substrate layer;
forming an element separation film by embedding a second insulating layer in the opening;
forming a first transistor on the semiconductor layer; and
forming a second transistor on the silicon substrate layer, with a portion of the second insulating layer being used as a gate insulating film and with the element separation film being disposed between the first transistor and the second transistor, the second transistor withstanding a higher voltage than the first transistor.

7. The method of manufacturing the semiconductor device according to claim 6, further comprising collectively forming a gate electrode of the first transistor and a gate electrode of the second transistor, respectively, on the semiconductor layer and the second insulating layer after formation of the second insulating layer.

8. The method of manufacturing the semiconductor device according to claim 6, further comprising forming a protruding part that protrudes toward side of the silicon substrate layer inside a formation region of the opening before the forming of the opening in the SOI substrate.

9. The method of manufacturing the semiconductor device according to claim 7, further comprising separating the second transistor to form the element separation film and the gate insulating film of the second transistor after the forming of the gate electrode of the first transistor and the gate electrode of the second transistor.

10. An electronic apparatus, comprising:
a semiconductor device, the semiconductor device including:
an SOI substrate in which a silicon substrate layer, a first insulating layer, and a semiconductor layer are layered in this order;
a first transistor provided on the semiconductor layer;
a second transistor provided on the silicon substrate layer; and
an element separation film provided between the first transistor and the second transistor,
the element separation film including a second insulating layer embedded in an opening, the opening penetrating the semiconductor layer and the first insulating layer and reaching an inside of the silicon substrate layer, and
a portion of the second insulating layer constituting a gate insulating film of the second transistor.

* * * * *